(12) United States Patent
Merrett et al.

(10) Patent No.: US 8,729,628 B2
(45) Date of Patent: May 20, 2014

(54) SELF-ALIGNED TRENCH FIELD EFFECT TRANSISTORS WITH REGROWN GATES AND BIPOLAR JUNCTION TRANSISTORS WITH REGROWN BASE CONTACT REGIONS AND METHODS OF MAKING

(75) Inventors: Joseph Neil Merrett, Xenia, OH (US); Igor Sankin, Perrysburg, OH (US)

(73) Assignee: Power Integrations, Inc., San Jose, CA (US)

( * ) Notice: Subject to any disclaimer, the term of this patent is extended or adjusted under 35 U.S.C. 154(b) by 163 days.

(21) Appl. No.: 13/585,183

(22) Filed: Aug. 14, 2012

(65) Prior Publication Data

US 2012/0305994 A1    Dec. 6, 2012

Related U.S. Application Data

(62) Division of application No. 11/934,805, filed on Nov. 5, 2007, which is a division of application No. 11/293,261, filed on Dec. 5, 2005, now Pat. No. 7,314,799.

(51) Int. Cl.
   *H01L 29/78* (2006.01)
(52) U.S. Cl.
   USPC ..... 257/334; 257/335; 257/341; 257/E29.256
(58) Field of Classification Search
   CPC ............ H01L 29/1608; H01L 29/7801; H01L 29/7802; H01L 29/66734; H01L 29/66712; H01L 29/4236
   USPC .................. 257/334–346, 565–571, E29.012, 257/E29.256
   See application file for complete search history.

(56) References Cited

U.S. PATENT DOCUMENTS

| | | |
|---|---|---|
| 4,587,712 A | 5/1986 | Baliga |
| 4,945,394 A | 7/1990 | Palmour et al. |
| 5,286,996 A | 2/1994 | Neudeck et al. |
| 5,350,699 A | 9/1994 | Nii |
| 5,481,126 A | 1/1996 | Subramanian et al. |
| 5,859,447 A | 1/1999 | Yang et al. |
| 6,049,098 A | 4/2000 | Sato |
| 6,455,364 B1 | 9/2002 | Asai et al. |
| 6,767,783 B2 | 7/2004 | Casady et al. |
| 6,917,054 B2 | 7/2005 | Onose et al. |
| 7,314,799 B2 | 1/2008 | Merrett et al. |
| 2001/0009800 A1 | 7/2001 | Hijzen et al. |

(Continued)

FOREIGN PATENT DOCUMENTS

EP    1 128 429 A1    8/2001

OTHER PUBLICATIONS

Li, et al. "Fabrication and Characterization of 4H-SiC P-N Junction Diodes by Selective-Epitaxial Growth Using TaC as the Mask" Journal of Electronic Materials, vol. 34, No. 4 (2005).

(Continued)

*Primary Examiner* — H Tsai

(57) ABSTRACT

Junction field-effect transistors with vertical channels and self-aligned regrown gates and methods of making these devices are described. The methods use techniques to selectively grow and/or selectively remove semiconductor material to form a p-n junction gate along the sides of the channel and on the bottom of trenches separating source fingers. Methods of making bipolar junction transistors with self-aligned regrown base contact regions and methods of making these devices are also described. The semiconductor devices can be made in silicon carbide.

31 Claims, 24 Drawing Sheets

(56) References Cited

U.S. PATENT DOCUMENTS

| | | |
|---|---|---|
| 2002/0192894 A1 | 12/2002 | Kalnitsky |
| 2003/0034495 A1 | 2/2003 | Casady et al. |
| 2003/0098465 A1 | 5/2003 | Suzumura et al. |
| 2004/0051136 A1 | 3/2004 | Kataoka et al. |
| 2005/0233539 A1 | 10/2005 | Takeuchi et al. |
| 2007/0175383 A1* | 8/2007 | Fukuda et al. ............... 117/35 |

OTHER PUBLICATIONS

L. Cheng, et al. "Cryogenic and High Temperature Performance of 4H-SiC Vertical Junction Field Effect Transistors (VJFETs) for Space Applications" Proceedings of the 17th International Symposium on Power Semiconductor Devices and IC's (ISPSD '05), May 22-26, 2005, Santa Barbara, CA.

C. Li, et al. "Selective Growth of 4H-SiC on 4H-SiC Substrates Using a High Temperature Mask" Materials Science Forum, vol's. 457-460 (2004), pp. 185-188.

J. N. Merrett, et al. "Gamma and Proton Irradiation Effects on 4H-SiC Depletion-Mode Trench JFET's" 5th European Conference on Silicon Carbide and Related Materials (ECSCRM2004), Aug. 31-Sep. 4, 2004, Bologna, Italy.

* cited by examiner

SELF-ALIGNED TRENCH FIELD EFFECT TRANSISTORS WITH REGROWN GATES AND BIPOLAR JUNCTION TRANSISTORS WITH REGROWN BASE CONTACT REGIONS AND METHODS OF MAKING

CROSS REFERENCE TO RELATED CASES

This application is a divisional of U.S. patent application Ser. No. 11/934,805, filed on Nov. 5, 2007, pending, which is a divisional of U.S. patent application Ser. No. 11/293,261, filed on Dec. 5, 2005, now U.S. Pat. No. 7,314,799. Each of the above-referenced applications is incorporated by reference herein in its entirety.

STATEMENT REGARDING FEDERALLY SPONSORED RESEARCH

This invention was made with U.S. Government support under Contract No. FA8650-04-C-5437, awarded by the U.S. Air Force. The U.S. Government may have certain rights in this invention.

BACKGROUND

1. Technical Field

This application relates generally to the field of semiconductor power devices designed for high speed, high power applications and, in particular, to the manufacture of field-effect transistors (FETs) having vertical channels and regrown p-n junction gates and to bipolar junction transistors (BJTs) with regrown base contact regions.

2. Background of the Technology

A field-effect transistor (FET) is a type of transistor commonly used for weak-signal amplification (e.g., for amplifying wireless signals). The device can amplify analog or digital signals. It can also switch DC or function as an oscillator. In the FET, current flows along a semiconductor path called the channel. At one end of the channel, there is an electrode called the source. At the other end of the channel, there is an electrode called the drain. The physical diameter of the channel is fixed, but its effective electrical diameter can be varied by the application of a voltage to a control electrode called the gate. The conductivity of the FET depends, at any given instant in time, on the electrical diameter of the channel. A small change in gate voltage can cause a large variation in the current from the source to the drain. This is how the FET amplifies signals.

The gate of an FET can be a metal-semiconductor Schottky barrier (MESFET), a p-n junction (JFET), or a metal-oxide-semiconductor gate (MOSFET). The p-n junction FET (JFET) has a channel of N-type semiconductor (N-channel) or P-type semiconductor (P-channel) material and a gate of semiconductor material of the opposite semiconductor type on the channel. The Metal-Semiconductor-Field-Effect-Transistor (MESFET) has a channel of N-type or P-type semiconductor material and a Schottky metal gate on the channel.

Bipolar junction transistors (BJTs) are semiconductor devices having two back-to-back PN junctions. BJTs have a thin and typically lightly doped central region known as the base (B) having majority charge carriers of opposite polarity to those in the surrounding material. The two outer regions of the device are known as the emitter (E) and the collector (C). Under the proper operating conditions, the emitter injects majority charge carriers into the base region. Because the base is thin, most of these charge carriers will ultimately reach the collector. The emitter is typically highly doped to reduce resistance and the collector is typically lightly doped to reduce the junction capacitance of the collector-base junction.

Semiconductor devices such as FETs and BJTs are typically made using ion implantation techniques. Ion implantation, however, requires high temperature post implant anneals which increases the time required to manufacture the device and which can result in damage to the device.

Accordingly, there still exists a need for improved methods of making semiconductor devices such as FETs and BJTs.

SUMMARY

According to a first embodiment, a method of making a semiconductor device is provided which comprises:

disposing a mask on an upper surface of a source/emitter layer of semiconductor material of a first conductivity type, wherein the source/emitter layer is on a channel layer of semiconductor material of the first conductivity type or a base layer of semiconductor material of a second conductivity type different than the first conductivity type, wherein the channel or base layer is on a drift layer of semiconductor material of the first conductivity type and wherein the drift layer is on a semiconductor substrate layer;

selectively etching through the source/emitter layer and into the underlying channel or base layer through openings in the mask to form one or more etched features having bottom surfaces and sidewalls;

epitaxially growing semiconductor material of the second conductivity type on the bottom surfaces and sidewalls of the etched features through openings in the mask to form gate regions/base contact regions, wherein the mask inhibits growth on the masked upper surface of the source/emitter layer;

subsequently filling the etched features with a planarizing material;

etching the gate regions/base contact regions until the gate regions/base contact regions no longer contact the source/emitter layer; and removing mask and planarizing material remaining after etching the gate regions/base contact regions.

According to a second embodiment, a method of making a semiconductor device is provided which comprises:

disposing an etch mask on an upper surface of a source/emitter layer of semiconductor material of a first conductivity type, wherein the source/emitter layer is on a channel layer of semiconductor material of the first conductivity type or a base layer of semiconductor material of a second conductivity type different than the first conductivity type, wherein the channel or base layer is on a drift layer of semiconductor material of the first conductivity type and wherein the drift layer is on a semiconductor substrate layer;

selectively etching through the source/emitter layer and into the underlying channel or base layer through openings in the etch mask to form one or more etched features having bottom surfaces and sidewalls;

removing the etch mask to expose the upper surface of the source/emitter layer;

epitaxially growing a gate layer/base contact layer of semiconductor material of the second conductivity type on the upper surface of the source/emitter layer and on the bottom surfaces and sidewalls of the etched features;

subsequently filling the etched features with a first planarizing material;

etching through the gate layer/base contact layer on the upper surface of the source/emitter layer to expose underlying source/emitter layer;

removing first planarizing material remaining after etching through the gate layer/base contact layer;

anisotropically depositing a dry etch mask material on the upper surface of the source/emitter layer and on bottom surfaces of the etched features;

etching the dry etch mask material to expose gate layer/base contact layer on the sidewalls of the etched features adjacent the upper surface of the source/emitter layer;

filling the etched features with a second planarizing material such that the gate layer/base contact layer adjacent the source/emitter layer on the sidewalls of the etched features is exposed;

etching through exposed gate layer/base contact layer on the sidewalls of the etched features adjacent the source/emitter layer to expose underlying source/emitter layer until the gate layer/base contact layer remaining in the etched features no longer contacts the source/emitter layer; and removing dry etch mask material and second planarizing material remaining after etching through exposed gate layer/base contact layer on the sidewalls of the etched features.

According to a third embodiment, a method of making a semiconductor device is provided which comprises:

disposing an etch mask on an upper surface of a channel layer of semiconductor material of a first conductivity type or a base layer of semiconductor material of a second conductivity type different than the first conductivity type, wherein the channel or base layer is on a drift layer of semiconductor material of the first conductivity type and wherein the drift layer is on a semiconductor substrate layer;

selectively etching the channel or base layer through openings in the mask to form one or more etched features having bottom surfaces and sidewalls;

removing the etch mask to expose the upper surface of the channel or base layer;

epitaxially growing a gate layer/base contact layer of semiconductor material of the second conductivity type on the upper surface of the channel or base layer and on the bottom surfaces and sidewalls of the etched features;

subsequently filling the etched features with a first planarizing material;

etching through the gate layer/base contact layer on the upper surface of the channel or base layer such that gate layer/base contact layer remains on the bottom surfaces and sidewalls of the etched features;

removing first planarizing material remaining after etching through the gate layer/base contact layer;

depositing a regrowth mask layer on the upper surface of the channel or base layer and on the gate layer/base contact layer on the bottom surfaces and sidewalls of the etched features;

subsequently filling the etched features with a second planarizing material;

etching through the regrowth mask layer on the upper surface of the channel or base layer to expose underlying channel or base layer, wherein regrowth mask layer remains on the gate layer/base contact layer on the bottom surfaces and sidewalls of the etched features;

removing second planarizing material remaining after etching through the regrowth mask layer;

epitaxially growing a first layer of semiconductor material of the first conductivity type on the upper surface of the channel or base layer, wherein the regrowth mask layer remaining on the gate layer/base contact layer on the bottom surfaces and sidewalls of the etched features inhibits growth of the first layer of semiconductor material of the first conductivity type;

epitaxially growing a second layer of semiconductor material of the first conductivity type on the first layer of semiconductor material of the first conductivity type, wherein the regrowth mask layer remaining on the gate layer/base contact layer on the bottom surfaces and sidewalls of the etched features inhibits growth of the second layer of semiconductor material of the first conductivity type; and removing remaining regrowth mask layer.

According to a fourth embodiment, a method of making a semiconductor device is provided which comprises:

disposing an etch mask on an upper surface of a source/emitter layer of semiconductor material of a first conductivity type, wherein the source/emitter layer is on a channel layer of semiconductor material of the first conductivity type or a base layer of semiconductor material of a second conductivity type different than the first conductivity type, wherein the channel or base layer is on a drift layer of semiconductor material of the first conductivity type and wherein the drift layer is on a semiconductor substrate layer;

selectively etching through the source/emitter layer and into the underlying channel or base layer through openings in the etch mask to form one or more etched features having bottom surfaces and sidewalls;

removing the etch mask to expose the upper surface of the source/emitter layer;

epitaxially growing a gate layer/base contact layer of semiconductor material of the second conductivity type on the upper surface of the source/emitter layer and on the bottom surfaces and sidewalls of the etched features;

subsequently filling the etched features with a planarizing material;

etching through the gate layer/base contact layer on the upper surface of the source/emitter layer and on the sidewalls of the etched features in contact with the source/emitter layer until the gate layer/base contact layer no longer contacts the source/emitter layer, wherein gate layer/base contact layer remains on the bottom surfaces of the etched features and on the sidewalls of the etched features in contact with the channel or base layer; and removing planarizing material remaining after etching through the gate layer/base contact layer.

According to a fifth embodiment, a method of making a semiconductor device is provided which comprises:

disposing an etch/regrowth mask on an upper surface of a source/emitter layer of semiconductor material of a first conductivity type, wherein the source/emitter layer is on a channel layer of semiconductor material of the first conductivity type or a base layer of semiconductor material of a second conductivity type different than the first conductivity type, wherein the channel or base layer is on a drift layer of semiconductor material of the first conductivity type and wherein the drift layer is on a semiconductor substrate layer;

selectively etching through the source/emitter layer and into the underlying channel or base layer through openings in the mask to form one or more etched features having bottom surfaces and sidewalls;

epitaxially growing semiconductor material of the second conductivity type on the bottom surfaces and sidewalls of the etched features through openings in the mask to form gate regions/base contact regions, wherein the mask inhibits growth on the masked upper surface of the source/emitter layer;

optionally removing the mask to expose the upper surface of the source/emitter layer;

depositing a dry etch mask material on bottom surfaces of the etched features and on either the upper surface of the source/emitter layer or on the mask;

etching the dry etch mask material to expose upper portions of the gate regions/base contact regions on the sidewalls of the etched features;

filling the etched features with a planarizing material such that the upper portions of the gate regions/base contact regions on the sidewalls of the etched features remain exposed;

etching through exposed gate layer/base contact layer on the sidewalls of the etched features adjacent the source/emitter layer to expose underlying source/emitter layer until the gate layer/base contact layer remaining in the etched features no longer contacts the source/emitter layer; and removing etch/regrowth mask and planarizing material remaining after etching through exposed gate layer/base contact layer on the sidewalls of the etched features.

Figure 1A:
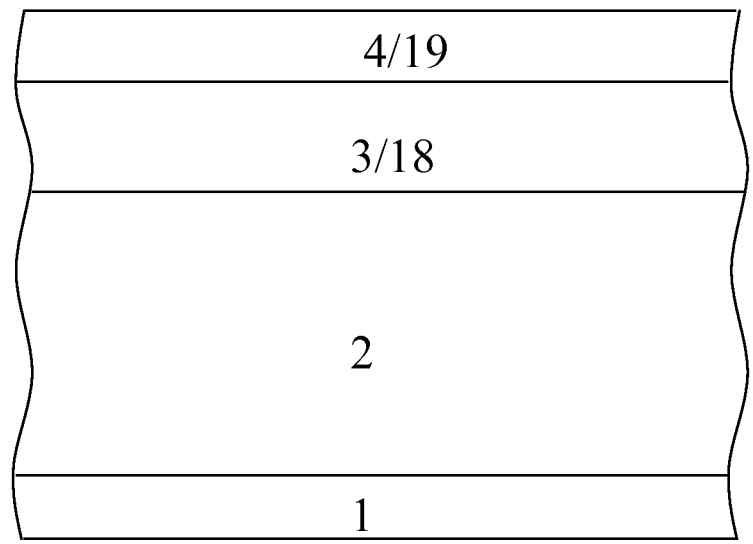
FIGS. 1A-1G illustrate the manufacture of either: a vertical trench FET having a p-n junction gate formed through selective regrowth using a self-aligned regrowth mask that doubles as a self-aligned dry etch mask; or a BJT having a base contact region formed through selective regrowth using a self-aligned regrowth mask that doubles as a self-aligned dry etch mask.

REFERENCE NUMERALS 1. n+ substrate (e.g., SiC)
2. n− drift layer (e.g., SiC)
3. n− channel layer (e.g., SiC)
4. n+ source layer (e.g., SiC)
5. Regrowth mask material (e.g. TaC)
6. Dry etch mask (e.g. Ni)
7. Epitaxially regrown p+ layer (e.g., SiC)
8. Planarizing material (e.g. flowable resist)
9. E-beam deposited metal suitable for dry etch mask (e.g. Al)
10. Planarizing material (e.g. flowable resist)
11. Planarizing material (e.g. flowable resist)
12. Isotropic or quasi isotropic regrowth mask (e.g. TaC)
13. Planarizing material (e.g. flowable resist)
14. Regrown n− layer (e.g., SiC)
15. Regrown n+ source contact layer (e.g., SiC)
16. Source ohmic contact metal (e.g. Ni)
17. Gate ohmic contact metal (e.g. Ni)
18. p base layer
19. n+ emitter layer

DETAILED DESCRIPTION

According to one embodiment, this application is directed to JFETs have regrown p-n gates. According to a further embodiment, this application is directed to bipolar junction transistors (BJTs) having regrown base contact layers.

JFETs can be formed with either vertical or horizontal channels. Vertical channel devices have the advantage of having a high channel packing density (See, for example, U.S. Pat. No. 4,587,712). A high channel packing density translates to high power densities, especially when the drain contact is formed on the backside of the substrate. This application describes the formation a vertical channel and, for the sake of illustration, assumes a drain contact on the backside of the wafer. However, devices with a vertical channel and a top side drain contact are also provided.

Self-aligned processes are desirable in the manufacture of semiconductor devices because they eliminate the cost of precise pattern realignment and eliminate the material area consumed in accounting for pattern misalignment. Minimizing excess area also helps to reduce device parasitics. A vertical trench JFET with an implanted gate allows for fairly straightforward self-aligned processing because the etch mask used to define the source regions can also be used to define the ion implant mask used during the implantation of the gate (U.S. Pat. No. 6,767,783, [2], [3]). In SiC, n-type material has lower resistivity than p-type material with the same doping concentration and yields ohmic contacts with lower contact resistance. N-type conductivity is therefore the conductivity of choice for the source, channel, drift, and drain regions of a SiC JFET. For an n-type channel, the gate must be p-type and vice versa. Exemplary p-type dopants for SiC are aluminum and boron, with aluminum being preferred. To produce good implanted p-type regions in SiC, implants can be performed at elevated temperatures, typically above 600° C. In addition, the wafer must be annealed at high temperatures to activate the implanted dopants. Typical temperatures required for the activation of implanted Al are over 1600° C. Elevated temperature implantation and high temperature activation anneals can significantly slow the cycle time for completing devices. Additionally, implanted material can result in "knock-on" damage beneath and beside the implant, which degrades the crystal quality of the semiconductor.

It is therefore advantageous to use a process that utilizes a gate made from regrown p-type material. U.S. Pat. No. 6,767,783 describes the basic concepts of various JFETs with epitaxial gates. The present application describes various techniques for manufacturing JFETs with epitaxial gates and BJTs with epitaxially regrown base contact regions. Although these techniques are described for the manufacture of SiC devices, these techniques can also be used to manufacture JFETs from semiconductor materials other than SiC.

The various embodiments of the invention described below can be formed on n-type, p-type, or semi-insulating SiC substrates of any crystallographic orientation. For the purpose of illustration, devices fabricated on n-type substrates will be described. The methods described are intended for devices with drain contacts made to the backside of the wafer. However, additional steps could be taken to fabricate devices with topside drain contacts. Methods for forming topside drain contacts are known and therefore will not be described herein. The preferred method for growing the different semiconductor layers in SiC is by CVD. However, the techniques described do not necessarily preclude the use other growth techniques including, for example, sublimation. Epitaxial layers grown on the wafer before any other processing (i.e., patterning, etching) will be referred to as, 'grown'. Epitaxial layers grown after some amount of device processing has begun will be referred to as, 'regrown'.

A method of making a SiC vertical trench field effect transistor (FET) with a selectively regrown p-n junction gate or a BJT with a selectively regrown base contact region is illustrated in FIGS. 1A-1D. As shown, the starting substrate material is $n^+$ doped. High doping is desirable to ensure low resistance of the substrate itself and for the formation of a good backside ohmic contact. In FIG. 1A a lightly doped $n^-$ drift layer 2 is epitaxially grown on a conducting n+ substrate 1. An n-type buffer layer may be grown on the substrate before growth of the drift layer. The buffer is not essential to the physics of device operation, but may be used to promote good epitaxial growth of the subsequent device epilayers. The doping and thickness of the n–drift layer should be tailored to withstand the maximum desired blocking voltage while keeping the resistance of the layer to a minimum. Drift layer doping concentrations are typically between $1 \times 10^{14}$ and $5 \times 10^{16}$ atoms/cm$^3$.

As shown in FIG. 1, an n-type channel layer 3 is epitaxially grown on the drift layer 2. Channel layer 3 is typically higher doped than drift layer 2. This layer can be optimized to obtain the desired pinch off voltage with maximum channel conductivity. For some applications, however, the channel layer 3 may have the same doping as the drift region 2 thereby eliminating the need for an additional channel epilayer 3 (i.e., the channel and drift layers as shown in FIG. 1 can be a single layer). Combining layers 2 and 3 does not change the basic functionality of the device. Typical doping concentrations for channel layer 3 lie in the range between $1 \times 10^{15}$ and $1 \times 10^{18}$ atoms/cm$^3$. As shown, highly doped $n^+$ source layer 4 is grown on top of channel layer 3. The high doping of this layer improves the quality of the source ohmic contact. This layer also serves as a field stop during depletion of the channel. The doping concentration of layer 4 should be at least $1 \times 10^{18}$ atom/cm$^3$, but a concentration greater than $1 \times 10^{19}$ atoms/cm$^3$ is preferred. The thickness of layers 2, 3, and 4 may be varied to obtain devices having desired characteristics.

Figure 1B:
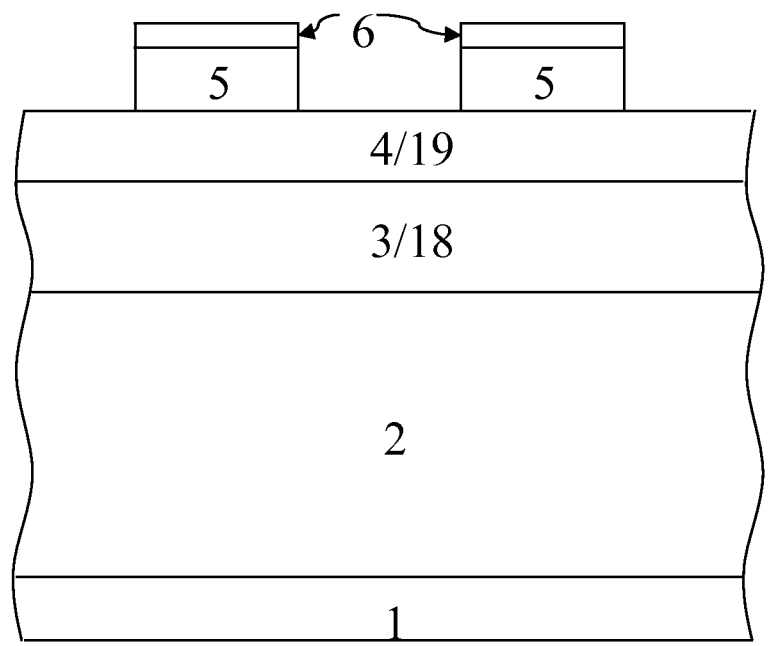

As shown in FIG. 1B, regrowth mask 5 and dry etch mask 6 are patterned on top of source layer 4 and define the source fingers. The regrowth mask can be made of any material that is suitable to withstand the temperatures and chemistry of the epitaxial growth process and that will prevent growth on the SiC areas covered by the regrowth mask and will not facilitate growth of SiC on top of the mask material itself. An example of a suitable mask material is TaC [1]. The dry etch mask 6 should be patterned directly on top of 5 and may be used as a dry etch mask to pattern 5. The thickness of dry etch mask 6 should be sufficient for etching through the SiC layer 4 and completely or partially through layer 3 in addition to the regrowth mask 5 if need be. The dry etch mask should also be made of a material that can be removed in such a way that enough of the regrowth mask 5 remains for following process steps. An exemplary dry etch mask is nickel metal.

Alternatively, a single layer mask comprising a regrowth mask material that also serves as an dry etch mask material can be used in place of the regrowth mask 5 and dry etch mask 6 layers shown in FIG. 1B.

Figure 1C:
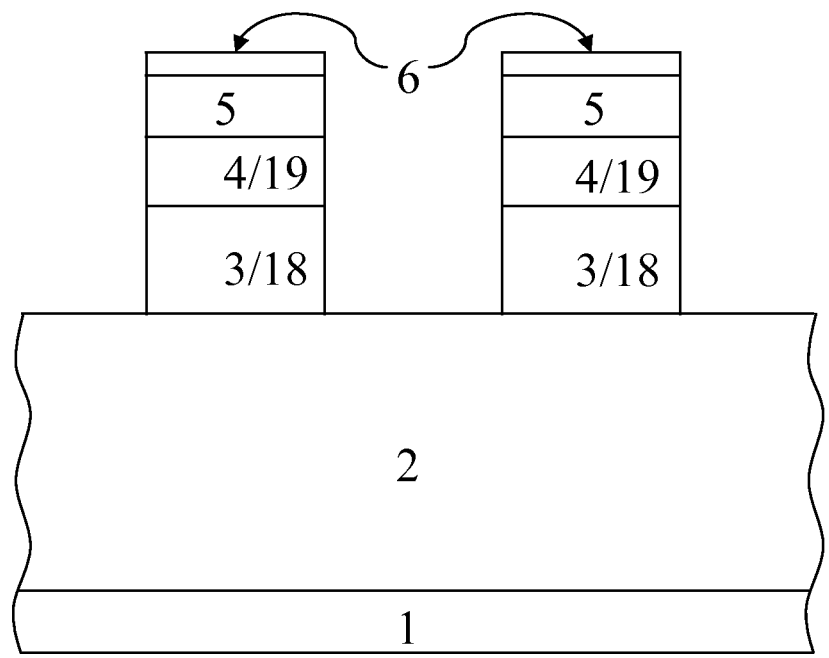

Next, as shown in FIG. 1C, the SiC regions not covered by layers 5 and 6 are dry etched through the $n^+$ layer 4 and through the channel layer 3. Ideally, the SiC dry etch should completely etch through layer 3 without etching into the drift layer 2. However, not completely etching through 3 or etching into 2 does not change the basic functionality of the device being fabricated and does not impact further processing steps. The dry etch should also be primarily anisotropic so that the sidewalls of the resulting SiC structures are mostly vertical. A small amount of sloping is acceptable.

Figure 1D:
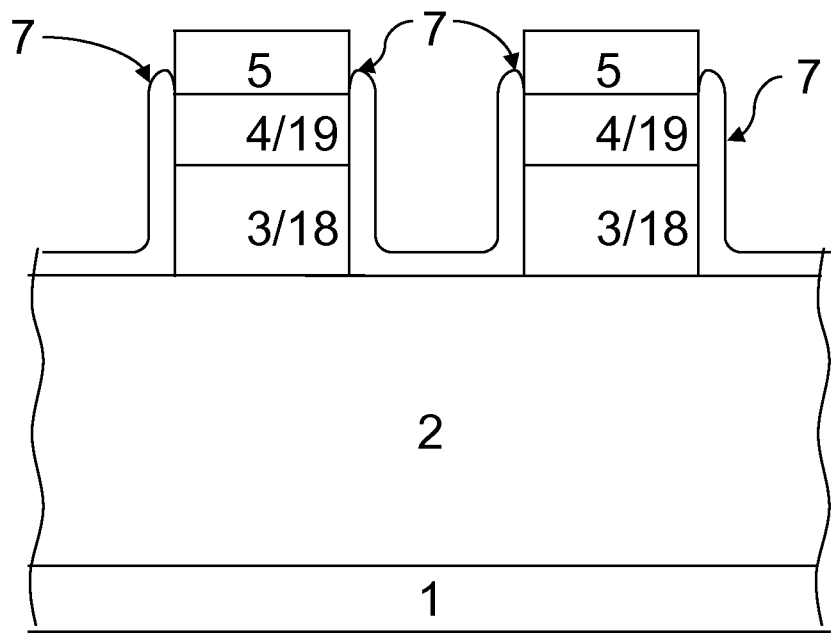

Following the SiC dry etch shown in FIG. 1D, the dry etch mask 6 is removed while the regrowth mask 5 is left on top of the source fingers. After removal of dry etch mask 6, a p-type SiC layer 7 is grown epitaxially over the SiC regions not covered by the regrowth mask material 5. This p-layer 7 forms the p-n junction gate of the transistor. The thickness of the regrown p-layer may be thick enough to fill the region between source fingers or only thick enough to cover the sides and bottom of the trenches as shown in FIG. 1D. Growing the p-layer thinner is preferable if one ohmic contact metal is to be deposited between the source fingers. If gate ohmic metal is desired, then the thickness of the gate epilayer should be thick enough that the ohmic metal does not spike though during ohmic contact formation. A thickness greater than 100 nm is sufficient, but layer 7 may be grown thicker to minimize risk of ohmic metal spiking. The maximum thickness depends on the depth and width of the gate trenches.

Figure 1E:
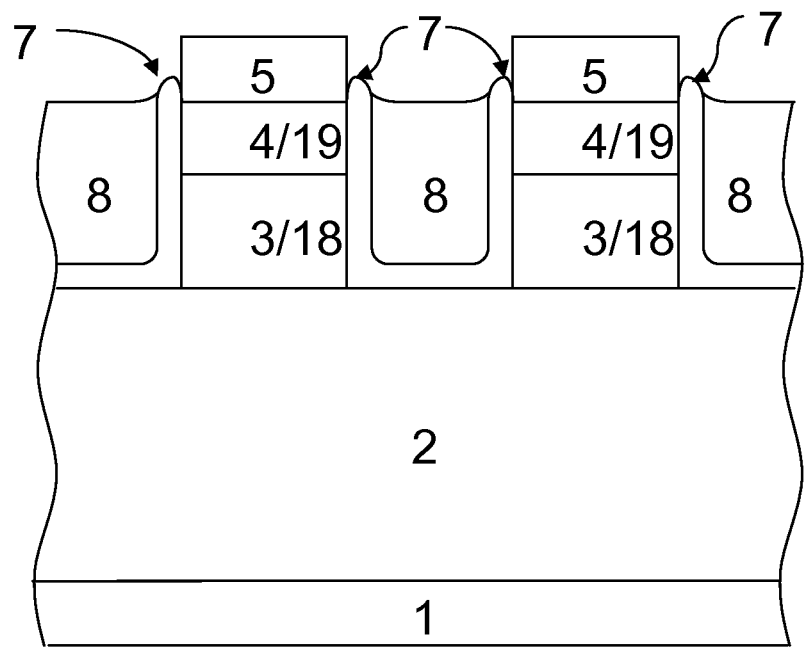

Next, the wafer is coated with a planarizing substance 8. This substance can be any material that when deposited is thinner on the tops of the source fingers than in between the fingers and in the field. Ideally, the surface of the planarizing material should be as close to the same level as possible across the wafer. Certain types of photoresist accomplish this quite well, such as Microposit LOR20B. An example of a planarizing process is to spin on photoresist and then bake it so that it reflows leaving a nearly planar surface. Other methods of planarization can also be used. For the sake of illustration, the process described will include planarization with a spin on photoresist. After applying the planarizing layer, it is selectively etched back using an appropriate etch method to expose the tops of the source fingers including the top of the regrown p-layer 7 as shown in FIG. 1E. An appropriate etch method for etching planarizing resist is oxygen plasma etching.

Figure 1F:
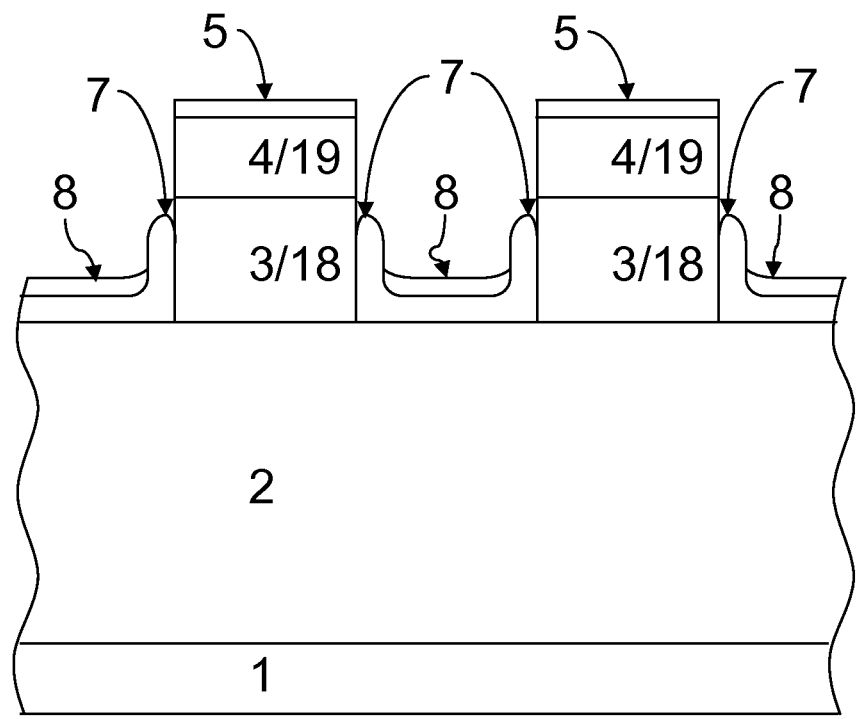

After the planarizing layer 8 is etched back, the exposed part of layer 7 is dry etched down until the none of the regrown gate layer 7 is in contact with the heavily doped $n^+$ layer 4 as shown in FIG. 1F. A slight amount of over etch may be necessary to improve the maximum reverse voltage of the p-n junction formed by the gate and channel layers. A certain amount of the planarizing layer 8 and the regrowth mask layer 5 will also be etched during the etching of the SiC layer 7. The amount of layers 5 and 8 removed will depend on the material used and the parameters of the SiC dry etch used. The thickness of layer 5 should be such that the amount of layer 4 remaining after etching is thick enough for ohmic contact formation. Some of layer 8 should also remain during etching so that the gate epi in the bottom of the trenches is protected. Layer 8 can be redeposited and etched back if the etch rate of layer 8 is too fast during the SiC etch.

Figure 1G:
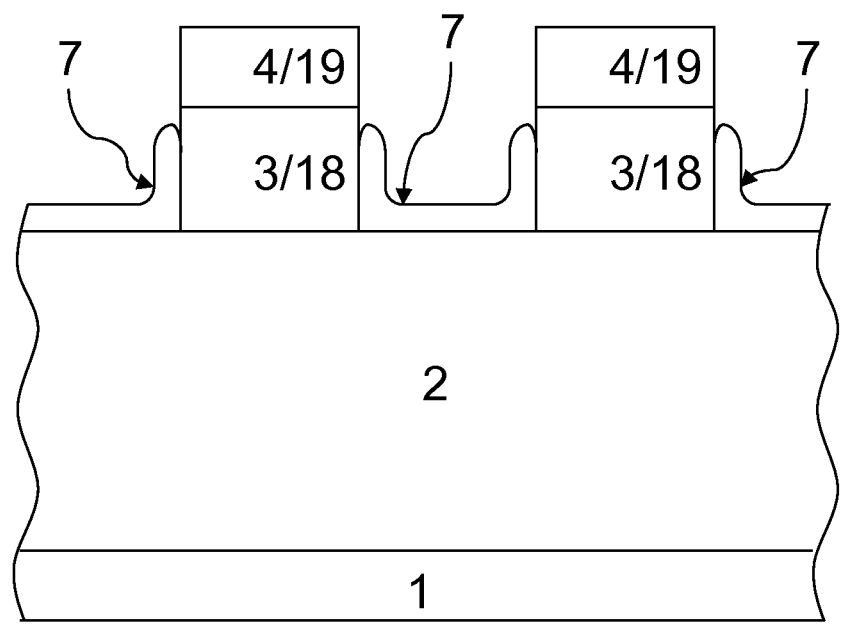

Once the gate layer is no longer in contact with the $n^+$ source layer, any remaining regrowth mask 5 and planarizing layer 8 are stripped by any appropriate wet or dry etch method as shown in FIG. 1G. At this point, all SiC layers have been formed. Standard methods for the formation of source, gate, and drain contacts as well as deposition or growth of passivation layers follow from this point. Source contacts are made to the tops of the source fingers on layer 4, gate contacts are made to layer 7, and the drain contact is made to substrate layer 1.

FIGS. 1A-1G also illustrate a corresponding method of making a BJT wherein n-type channel layer 3 is substituted with a p-type semiconductor material 18 which forms the base of the device. In this device, n-type layer 19 forms the emitter and p-type regrown layer 7 functions as a base contact. Emitter contacts are made to the tops of the emitter regions 19, base contacts are made to layer 7, and the drain contact is made to substrate layer 1.

Figure 2A:
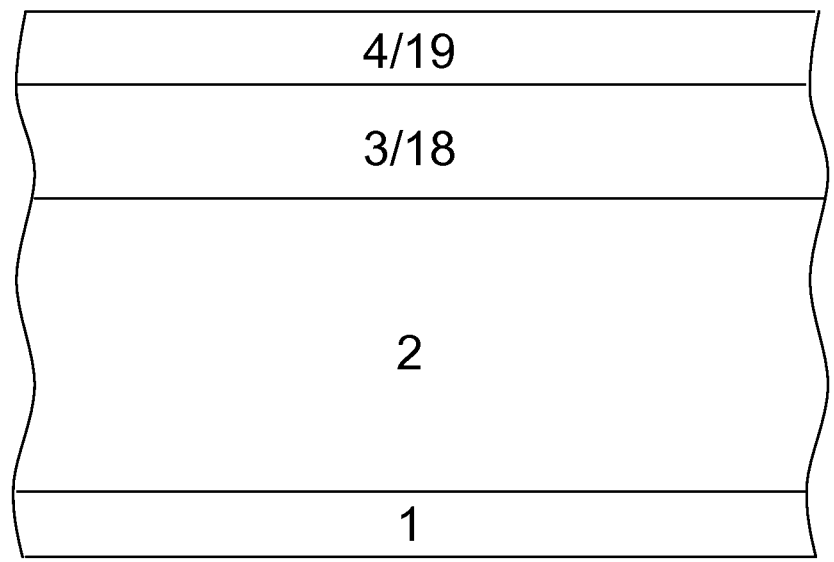
FIGS. 2A-2K illustrate the manufacture of either: a vertical trench FET having a p-n junction gate formed through regrowth and etch back using self-aligned post-regrowth etch mask metallization; or a BJT having a base contact region formed through regrowth and etch back using self-aligned post-regrowth etch mask metallization.
Figure 2B:
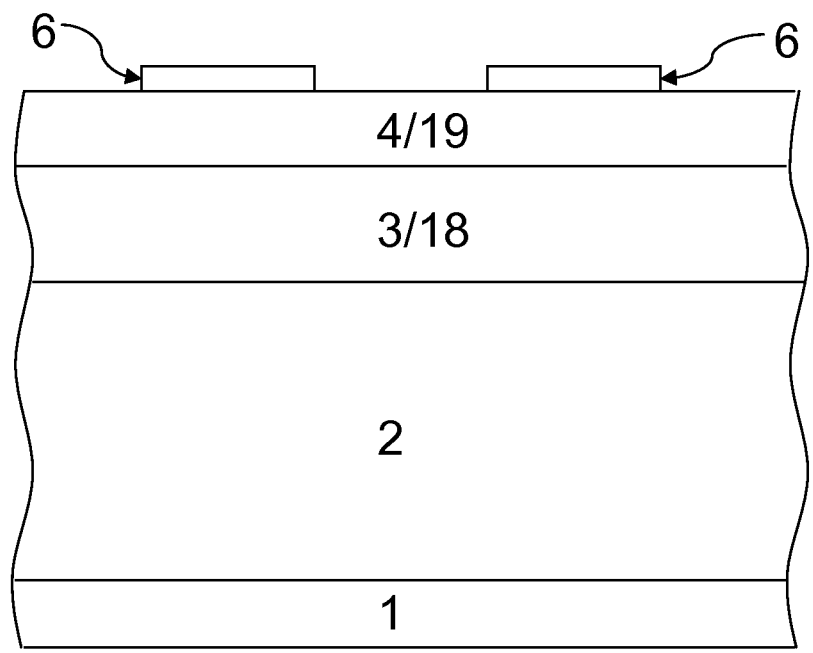
Figure 2C:
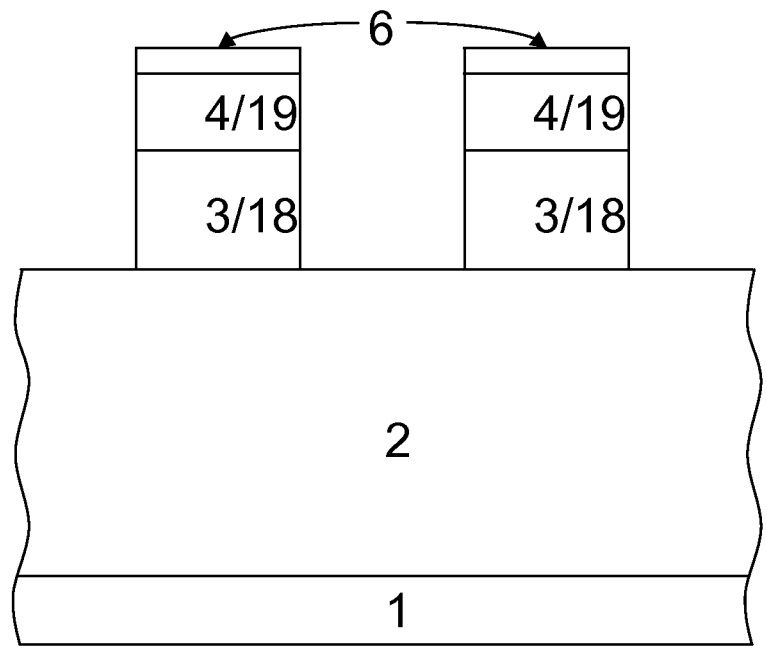

FIGS. 2A-2K illustrate the manufacture of a SiC vertical trench FET having a p-n junction gate formed through epitaxial regrowth and etch back using self-aligned post-epi growth etch mask metallization. In this process, drift 2, channel 3, and source 4 layers are epitaxially grown on a conducting $n^+$ substrate as shown in FIG. 2A. Unlike the process described in FIGS. 1A-1G, however, a dry etch mask 6 is patterned to define the source regions without a regrowth mask underneath as shown in FIG. 2B. The exposed SiC is then etched down to define the source and channel regions in the same manner as the process illustrated in FIG. 1. The resulting structure is shown in FIG. 2C.

Figure 2D:
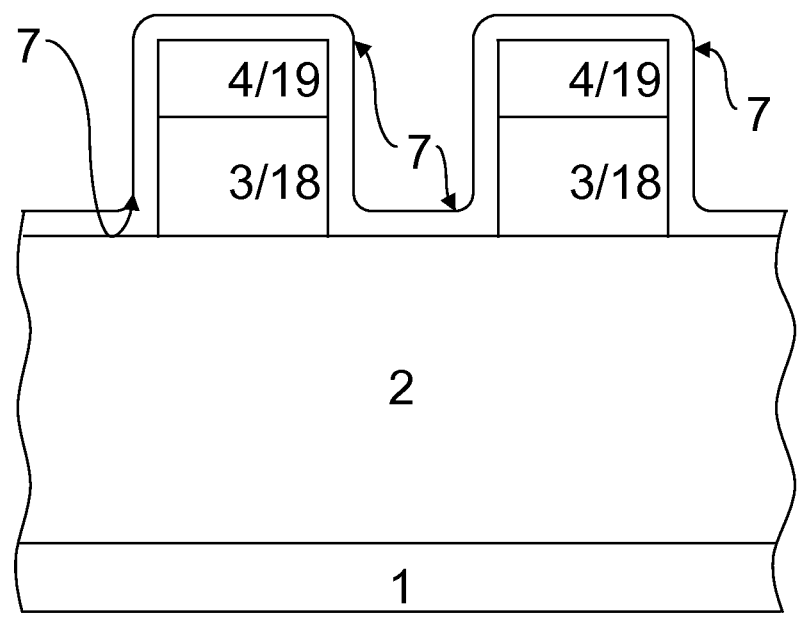
Figure 2E:
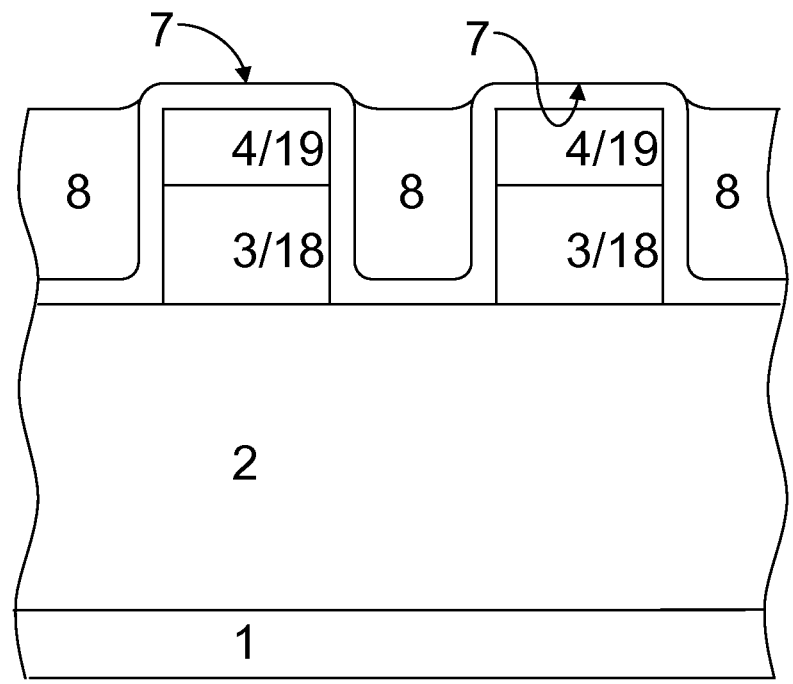
Figure 2F:
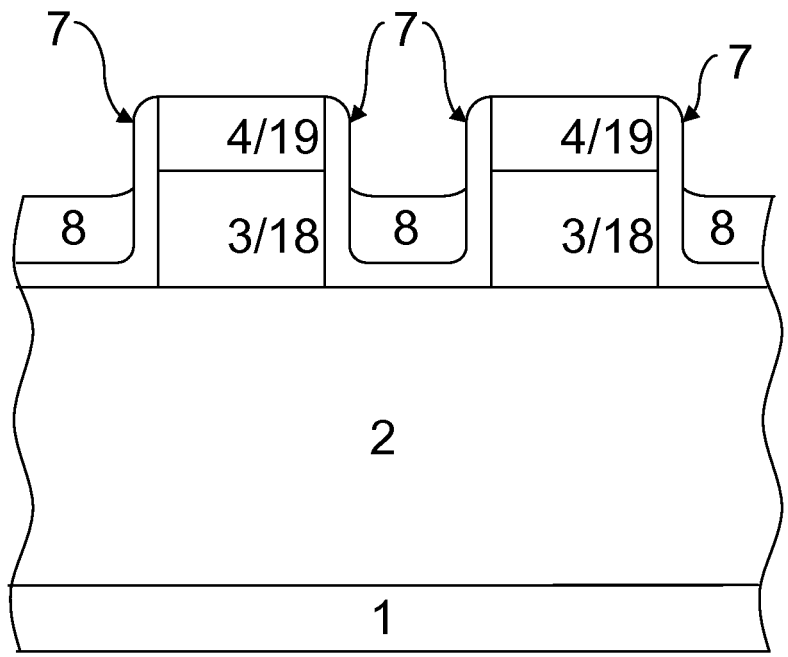

Next, the etch mask 6 is stripped and a p-type SiC layer 7 is grown over the entire etched surface as shown in FIG. 2D. The thickness of layer 7 and spacing between source fingers should be such that the space between the source fingers is not completely filled during regrowth of layer 7. A planarizing layer 8 is then deposited and etched back to expose the SiC layer 7 only on the tops of the source fingers as shown in FIG. 2E. A SiC dry etch is then used to remove the p-type SiC of layer 7 from the tops of the $n^+$ source layer 4 as shown in FIG. 2F. Any remaining planarizing layer 8 is then removed (not shown). Source, gate, and drain ohmic contact formation can be performed at this point, but this option is not shown here and can also be formed later in the process flow.

Figure 2G:
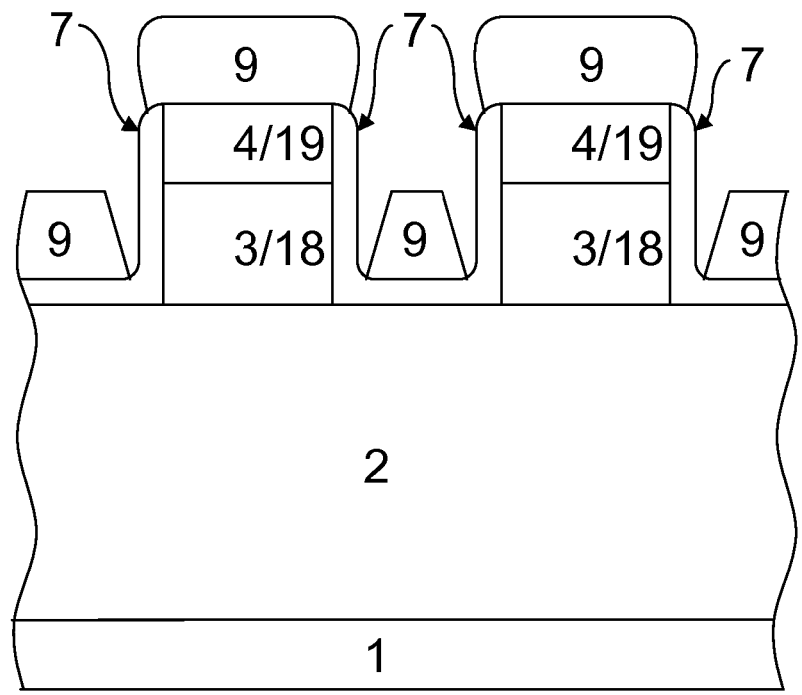
Figure 2H:
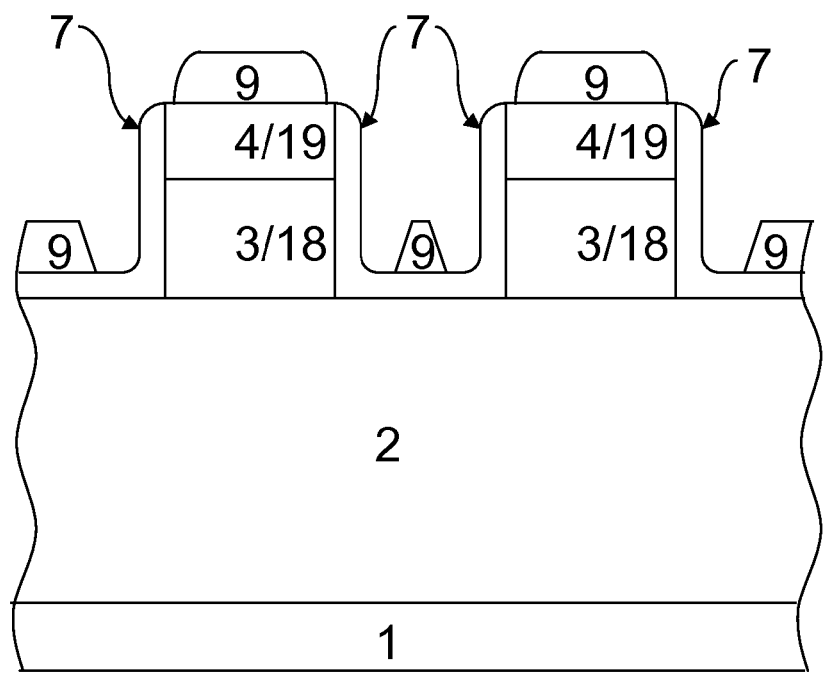
Figure 2I:
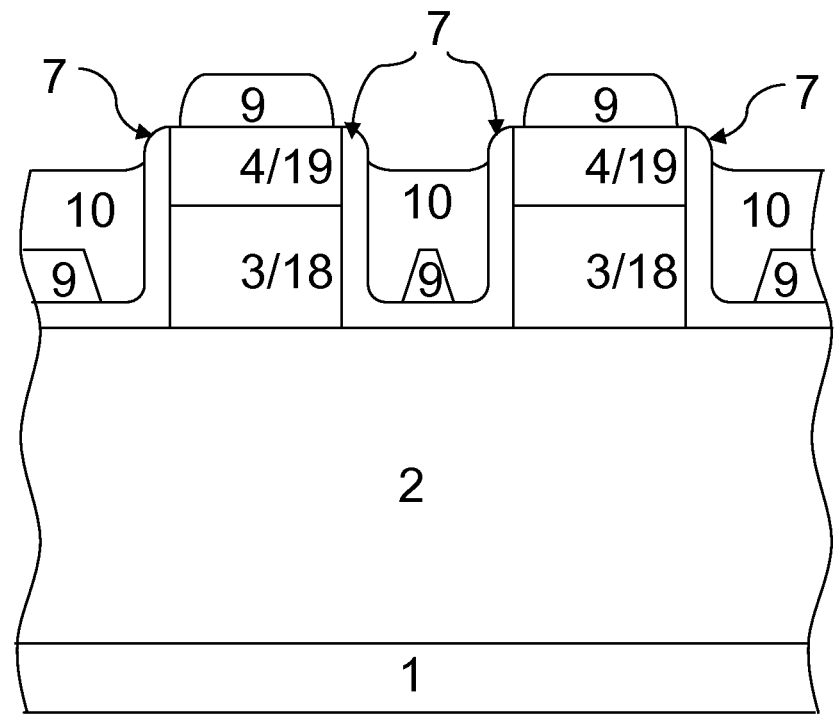

Next, a dry etch mask material 9 is anisotropically deposited such that there is very little of the mask material deposited on the sides of the source fingers. An example would be Al metal deposited by e-beam evaporation as shown in FIG. 2G. This mask layer 9 is then isotropically etched by either wet or dry process until the mask material has receded enough to expose the gate layer 7 along the sides of the source fingers as shown in FIG. 2H. The mask layer 9 should be deposited thick enough such that the etch mask material has sufficient vertical thickness to be used as a SiC dry etch mask after the desired amount of horizontal recess has been achieved. A planarizing layer 10 is then deposited and etched back to expose the tops of the source fingers including the top portions of layer 7 on the sides of the source fingers as shown in FIG. 2I. The order of the processes illustrated in FIGS. 2H and 2I can be reversed.

Figure 2J:
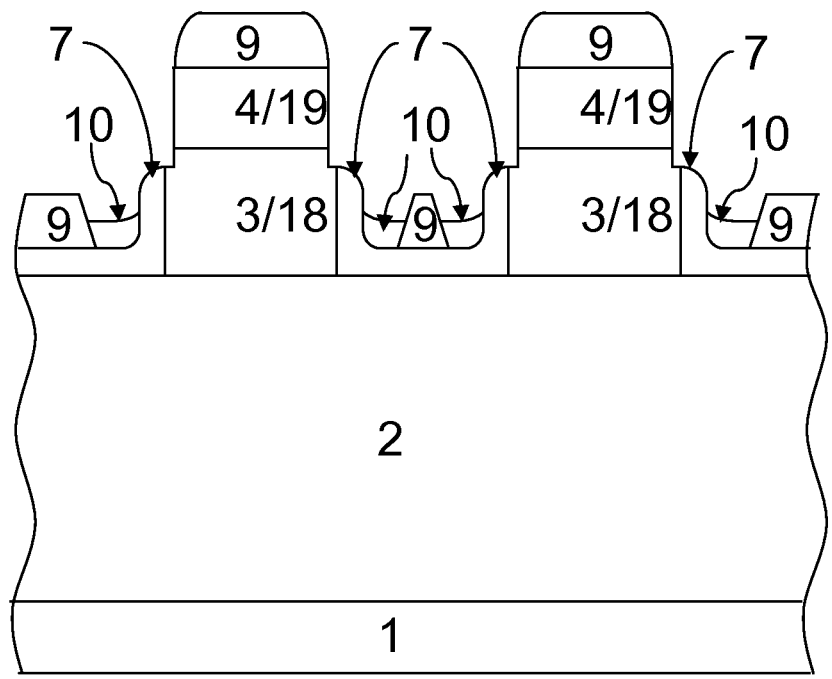
Figure 2K:
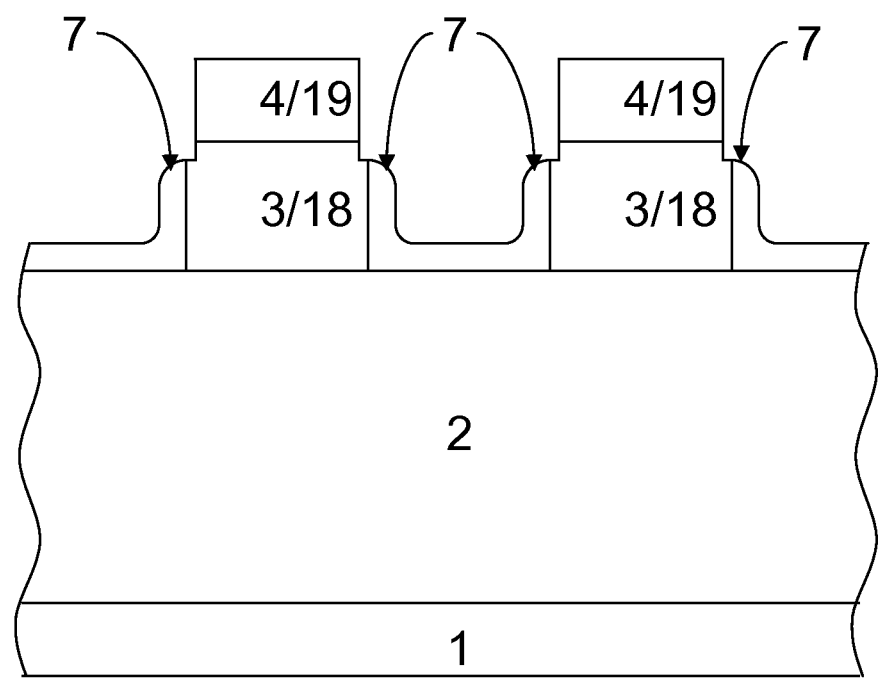

The exposed portion of layer 7 is then dry etched down until none of layer 7 is in contact with the $n^+$ source layer 4 as shown in FIG. 2J. A certain amount of overetch can be used to increase the maximum reverse voltage of the source to gate p-n junction. If ohmic contacts were formed on top of the source fingers prior to the deposition of layers 9 and 10, the exposed ohmic contact metallization must first be etched away before the SiC etch is performed. Layers 9 and 10 should be thick enough to protect the tops of the source fingers and the bottom surfaces of the gate trenches during the SiC etch.

The planarizing layer 10 and self-aligned etch mask 9 are then stripped and the device is ready to receive ohmic contacts and passivation. If ohmic contacts were formed prior to the last SiC etch, the self-aligned etch mask 9 may be left to serve as additional metallization on top of the source and gate ohmic contacts.

FIGS. 2A-2K also illustrate a corresponding method of making a BJT wherein channel layer 3 is substituted with a layer of p-type semiconductor material 18 which forms the base of the device. In this device, n-type layer 19 forms the emitter and p-type regrown layer 7 functions as a base contact.

Figure 3A:
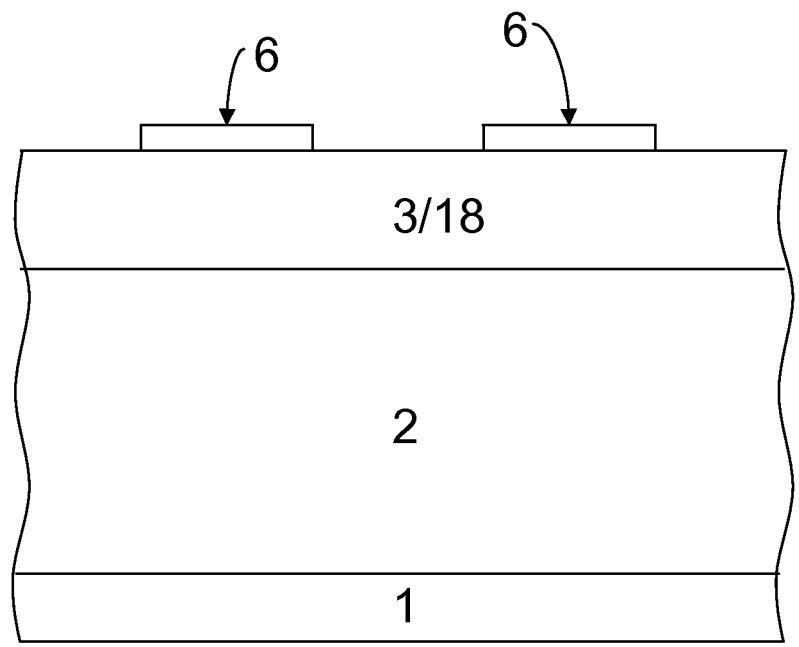
FIGS. 3A-3K illustrate the manufacture of either: a vertical trench FET having a p-n junction gate formed through regrowth of the gate followed by etch back and selective regrowth of opposite conductivity material to form the top of the source finger; or a BJT having a base contact region formed through regrowth followed by etch back and selective regrowth of opposite conductivity material to form emitter regions.
Figure 3B:
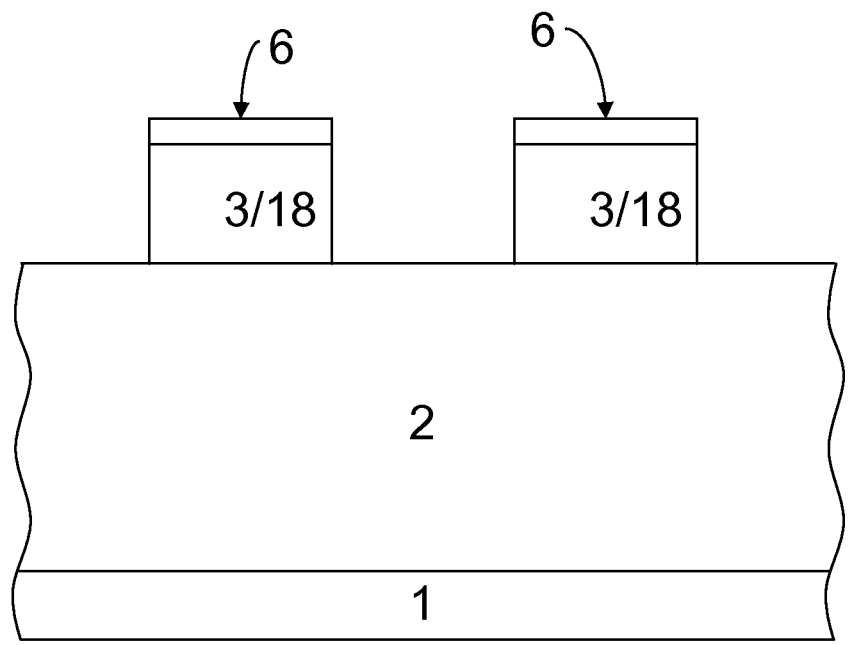
Figure 3C:
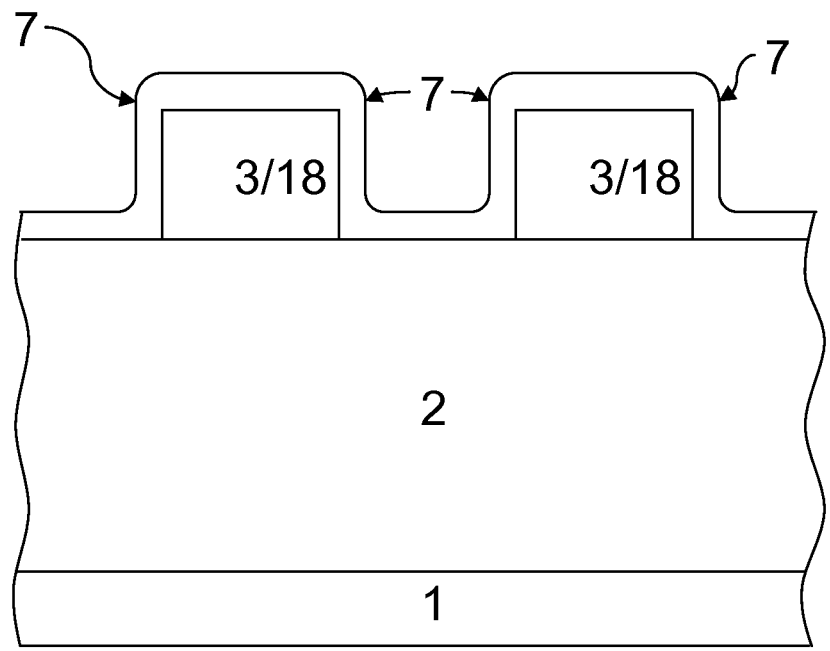

FIGS. 3A-3K illustrate the manufacture of a SiC vertical trench FET having a p-n junction gate formed through epitaxial regrowth of the p-type material followed by etch back and regrowth of additional channel epi and the $n^+$ source layer. In this process, only the drift layer 2 and channel layer 3 are initially grown on substrate 1. A dry etch mask 6 is then patterned on top of layer 3 to define where the source fingers as shown in FIG. 3A. The exposed SiC is dry etched down through the channel layer 3 as shown in FIG. 3B. The dry etch mask 6 is then stripped and a p-type SiC layer 7 is regrown as shown in FIG. 3C.

Figure 3D:
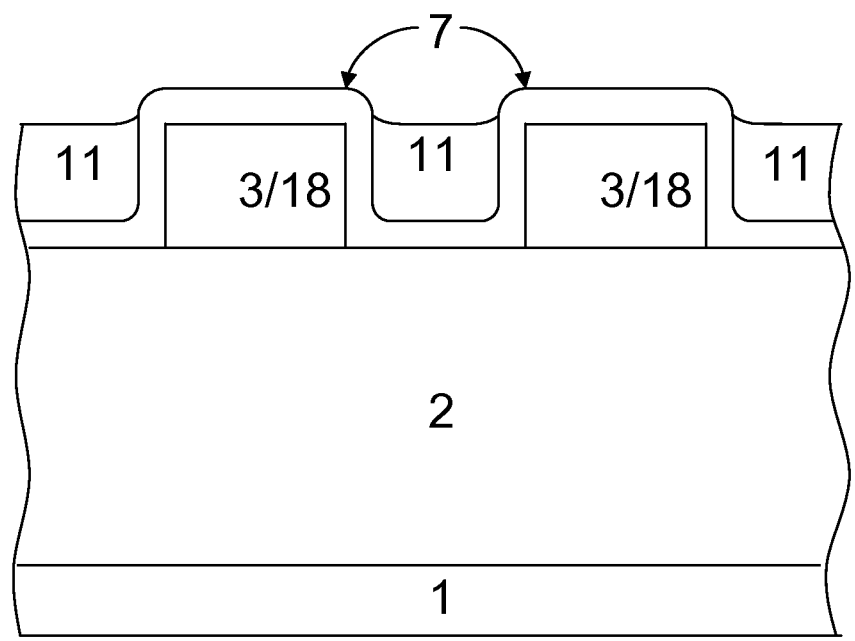
Figure 3E:
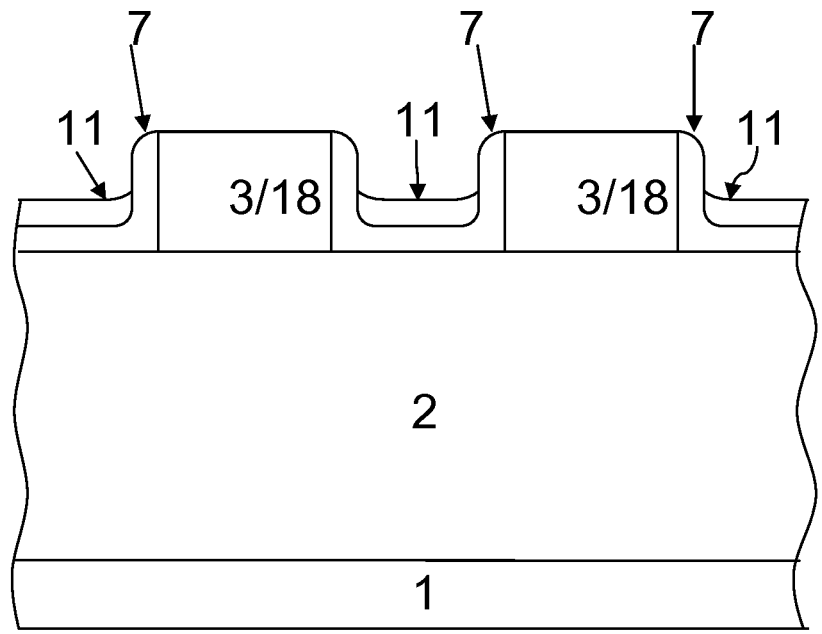

The p-type SiC is removed from the tops of the fingers by first depositing and etching back at planarizing layer 11 as shown in FIG. 3D and then dry etching the exposed SiC until the channel layer 3 is exposed on the tops of the fingers as shown in FIG. 3E.

Figure 3F:
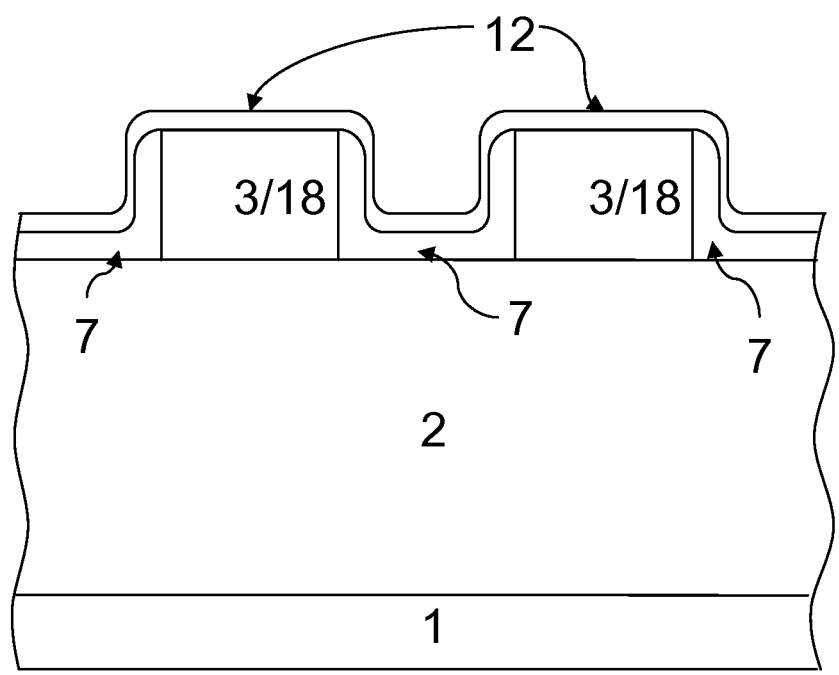
Figure 3G:
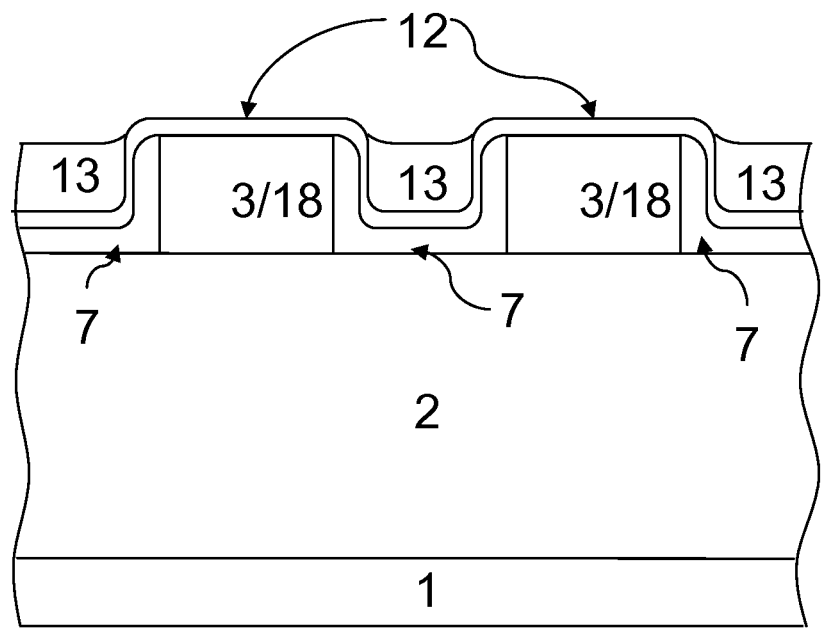
Figure 3H:
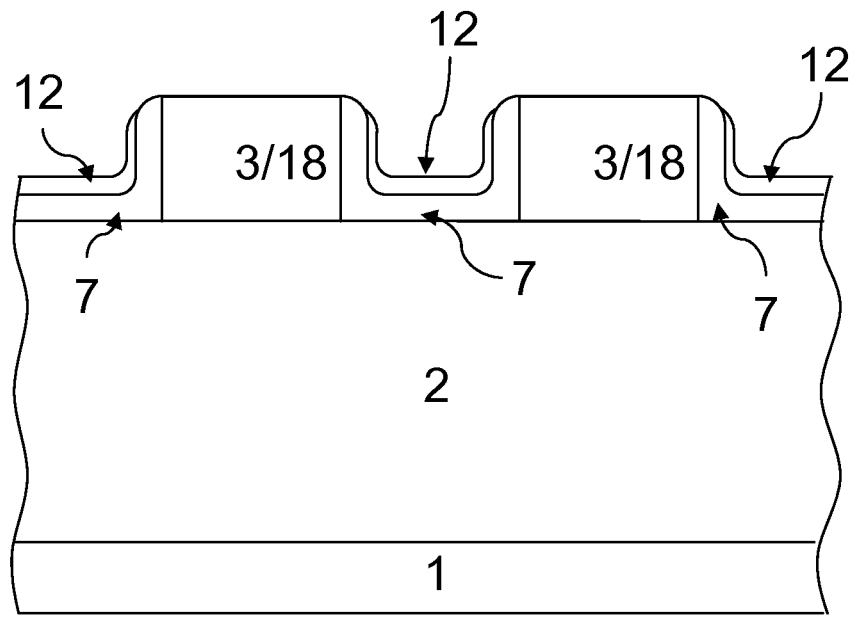

After remaining layer 11 has been removed, an isotropic or quasi-isotropic regrowth mask 12 is deposited such that the mask material is deposited on the horizontal and vertical SiC surfaces as shown in FIG. 3F. A second planarizing layer 13 is deposited and etched back to expose layer 12 on the tops of the source fingers as shown in FIG. 3G. The exposed regrowth mask 12 is then etched away with and appropriate dry or wet etch followed by stripping the planarizing coating 13. The resulting structure is shown in FIG. 3H.

Figure 3I:
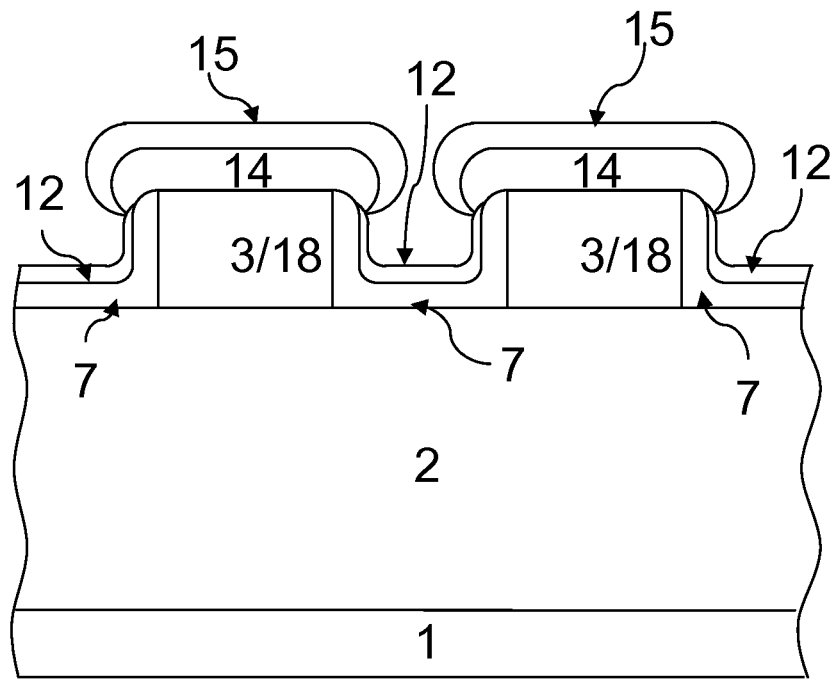
Figure 3J:
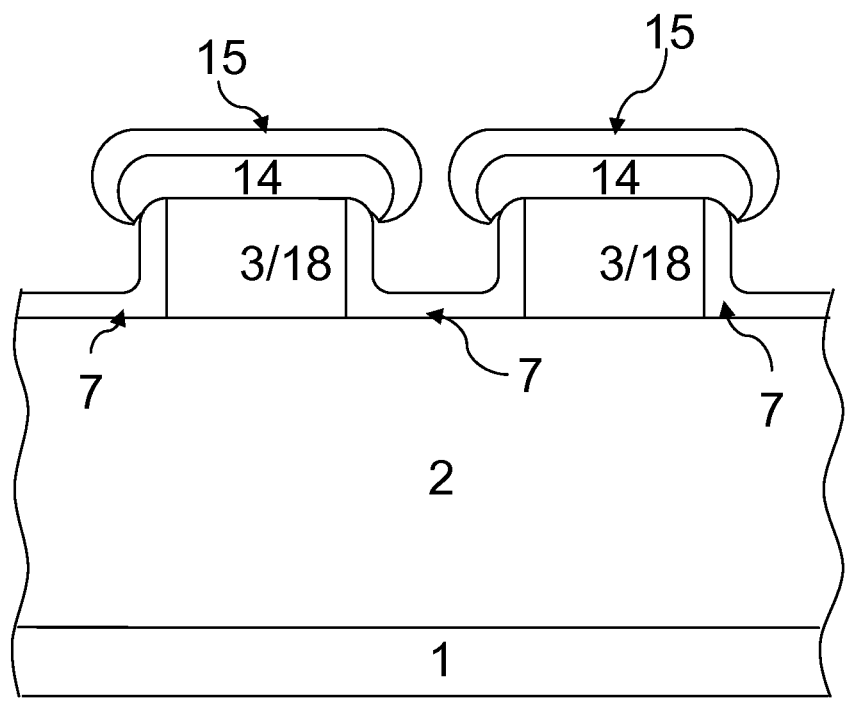

Next, as shown in FIG. 3I, an n-type layer 14 is regrown on the tops of the fingers only where the regrowth mask 12 has been removed and an additional $n^+$ SiC layer 15 is grown on top of layer 14 on which source ohmic contacts will be formed later. The purpose of layer 14 is to separate the p-type gate layer 7 from the highly doped $n^+$ layer 15. This prevents low reverse breakdown of the gate to source p-n junction that results when a $p^+$-$n^+$ junction is formed. Therefore, the thickness and doping of layer 14 should be such that the reverse breakdown of the junction formed between layers 7 and 14 is higher than the voltage necessary to pinch off the device channel. After regrowth of layers 14 and 15, the regrowth mask can be stripped as shown in FIG. 3J.

Figure 3K:
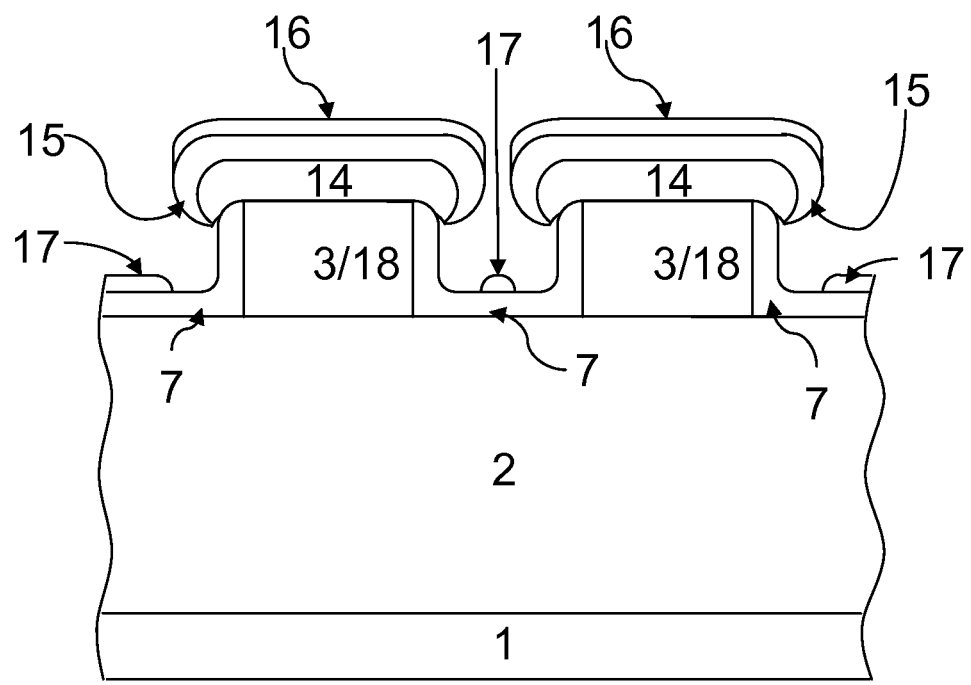

Due to the somewhat isotropic nature of the regrowth process, a certain amount of overhang will be present on the sides of the source fingers. The amount of overhang depends on the thickness of layers 14 and 15. During ohmic and overlay metallization the overhang will prevent deposition of metal on the finger sidewalls if the method of depositing the metal is somewhat directional. In this way, gate and source metal can be deposited simultaneously without the need for additional patterning and will greatly reduce the risk of metal shorting from the gate to the source. Self-aligned metal deposition utilizing the regrowth overhang is shown in FIG. 3K. Additionally, if overlay metal is deposited at a thickness much greater than the spacing between the overhang, the gap between the overhang may be completely closed forming a self-aligned air bridge structure. Plating or sputtering are two methods that would be suitable for closing the gap between source fingers since both methods have some degree of lateral deposition.

FIGS. 3A-1K also illustrate a corresponding method of making a BJT wherein channel layer 3 is substituted with a layer of p-type semiconductor material 18 which forms the base of the device. In this device, n-type layer 15 forms the emitter and p-type regrown layer 7 functions as a base contact region. A collector contact can be formed on the backside of substrate 1.

Figure 4A:
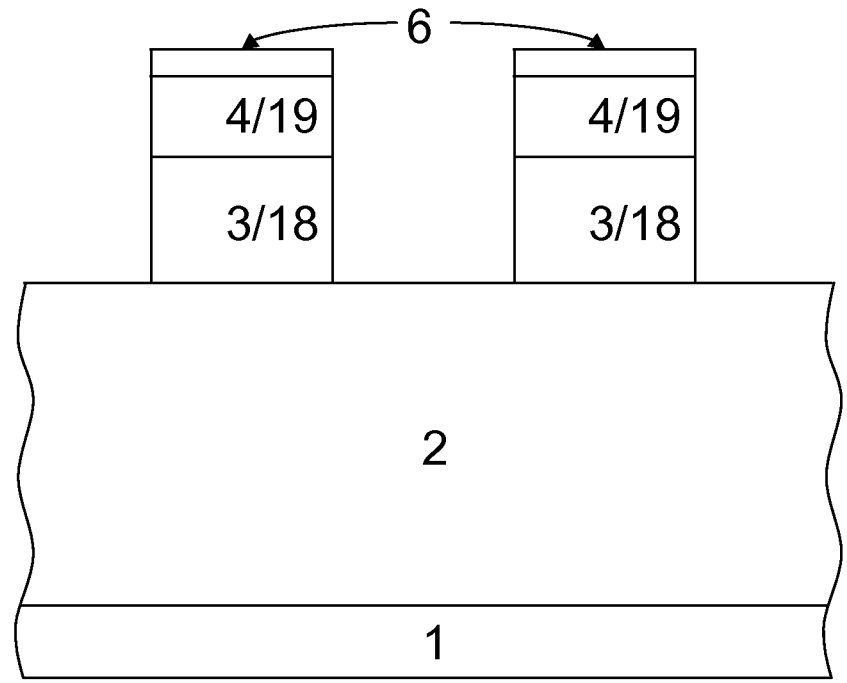
FIGS. 4A-4E illustrate the manufacture of either: a SiC vertical trench FET having a p-n junction gate formed through regrowth and where the gate layer is separated from the source by isotropic ion milling the gate epi off of the tops and sides of the source epi layer; or a BJT having a base contact region formed through regrowth wherein the base contact layer is separated from the emitter by isotropic ion milling the base contact epi off of the tops and sides of the emitter epi layer. This method also utilizes a planarizing mask material to protect the gate or base contact epi on the bottom and sides of the etched features.
Figure 4B:
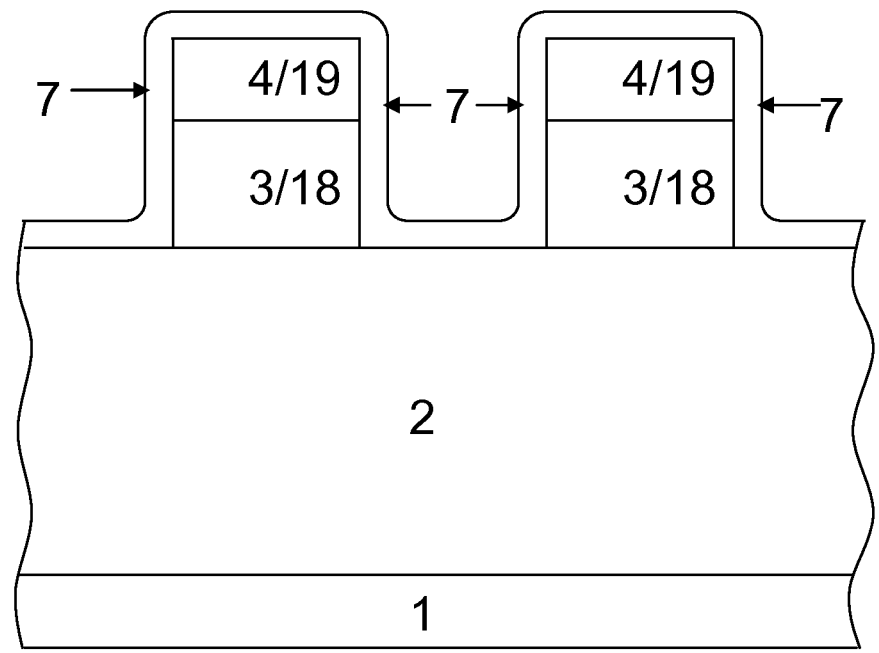

FIGS. 4A-4E illustrate the manufacture of a SiC vertical trench FET having a p-n junction gate formed through epitaxial regrowth of the gate layer followed by selectively etching the gate epi from the source epi using isotropic dry etching with a planarizing mask material. In this process the drift 2, channel 3, and source layers 4, are grown on substrate 1. A dry etch mask 6 is patterned to define the source regions. The exposed SiC is then dry etched down through the source layer 4 and channel layer 3, as shown in FIG. 4A. The dry etch mask 6 is then stripped and a p-type SiC layer 7 is regrown as shown in FIG. 4B.

Figure 4C:
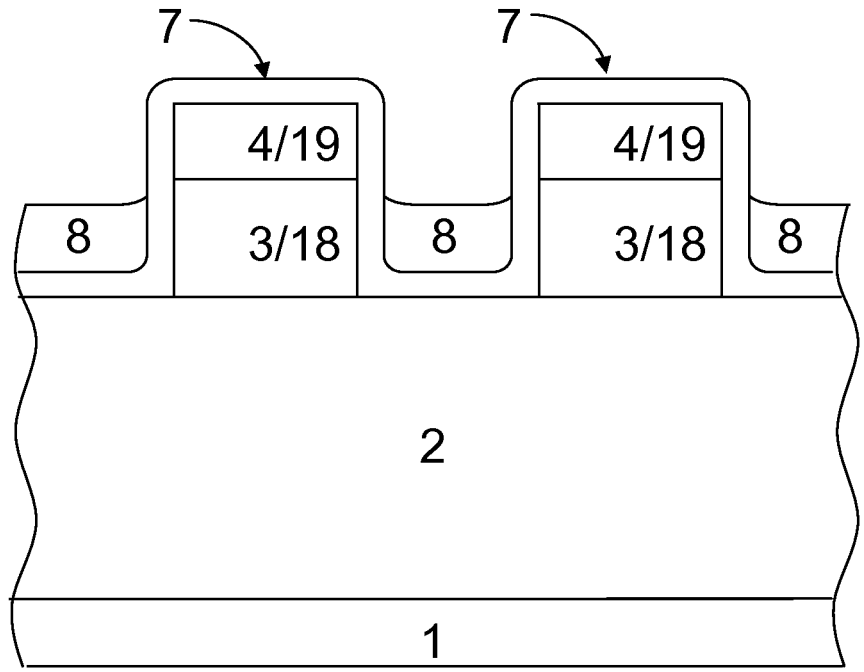
Figure 4D:
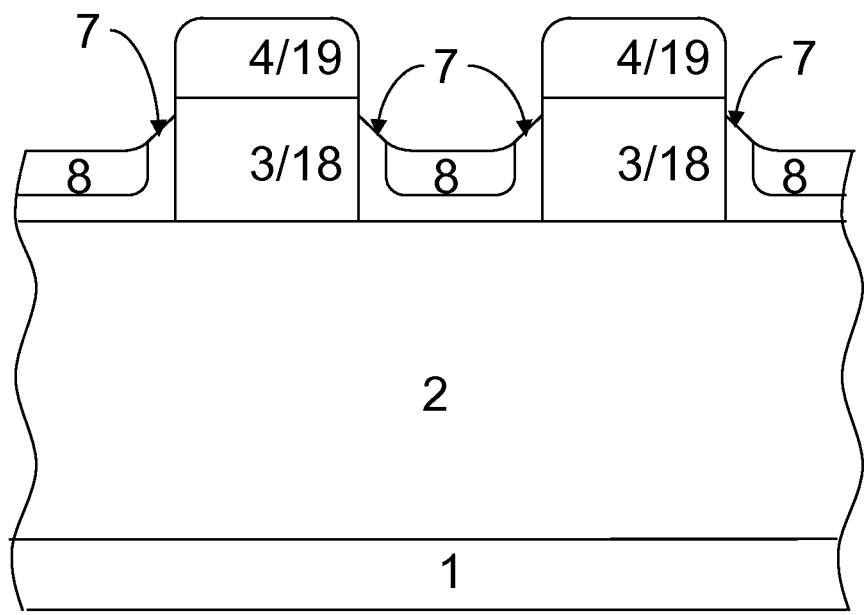

A planarizing material 8 is deposited and selectively dry etched down to a height below the elevation of the source contact layer 4 as shown in FIG. 4C. The exposed gate epitaxy 7 is then dry etched away using a suitable dry etch as shown in FIG. 4D. The dry etch should be sufficiently isotropic to remove the gate material from the sides and tops of the source fingers at approximately the same time. The dry etch should also have reasonable selectivity between the mask material 8 and the SiC layer 7. If the etch rate of the planarizing mask is appreciably faster than the SiC etch rate, the planarizing mask process can be repeated as many times as necessary to complete the etch. The preferred dry etch technique for this process is ion milling in a system where the angle of incidence of the ion bombardment can be varied during the etch so that all facets of the exposed SiC layer 7 are etched. The preferred method for achieving this is to mount the sample to be etched on a rotating stage whose axis is at some angle to the angle of incidence of the bombarding ions.

Figure 4E:
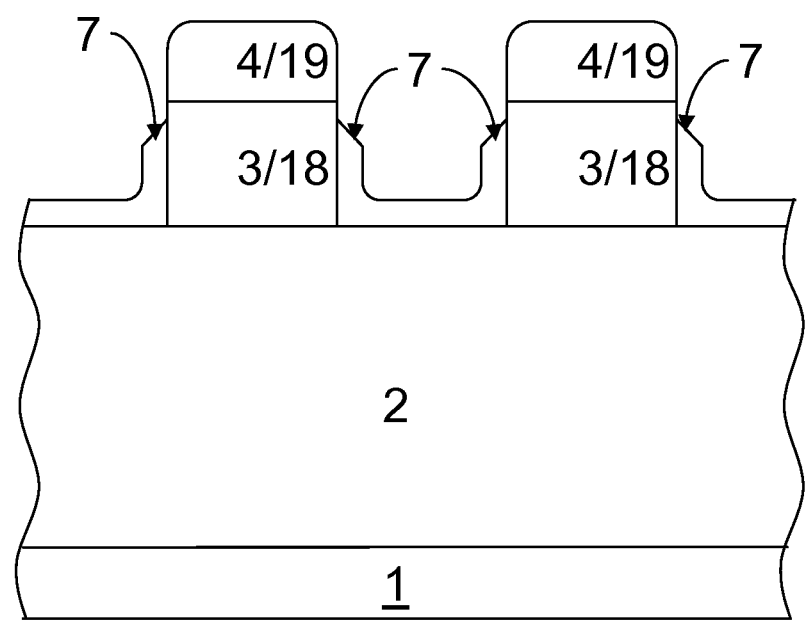

After the sample has been etched so that the gate layer 7 is not in contact with the highly doped source layer 4, the planarizing mask 8 is removed by an appropriate wet or dry method as shown in FIG. 4E. At this point, the device is ready for any passivation and contact metallization suitable for the other designs described previously.

FIGS. 4A-4E also illustrate a corresponding method of making a BJT wherein channel layer 3 is substituted with a layer of p-type semiconductor material 18 which forms the base of the device. In this device, n-type layer 19 forms the emitter and p-type regrown layer 7 functions as a base contact.

The fabrication processes illustrated in FIGS. 1, 2, 3, and 4 as presented above are for making vertical transistors with field effect gates. As also set forth above, these same processes can be altered to fabricate bipolar junction transistors (BJTs) by replacing the n-type channel layer 3 with a p-type base layer 18. In these devices, the source layer 4 of FIGS. 1, 2 and 4 and the source contact layer 15 of FIG. 3 would serve as the emitter layer. The first etch to define the source fingers would then etch until the n-type drift layer below the p-type base layer is exposed. The remaining steps may follow just as those described for the field effect devices.

Figure 5A:
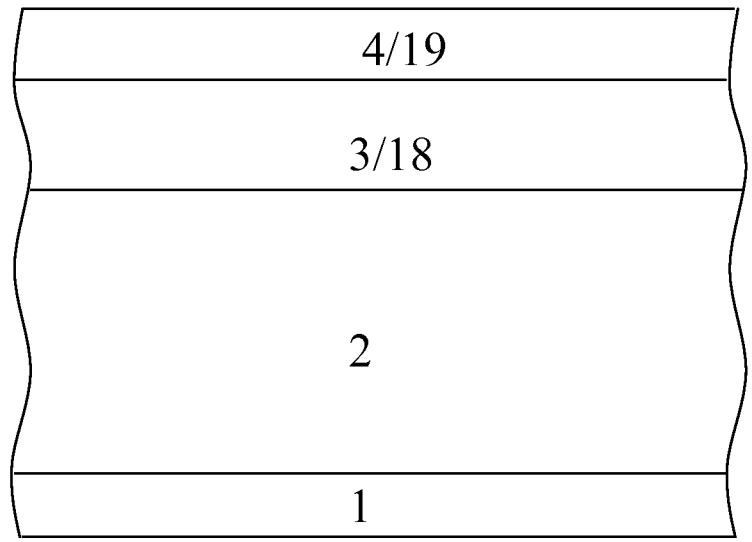
FIGS. 5A-5I illustrate the manufacture of either: a vertical trench FET having a p-n junction gate formed through selective regrowth using a self-aligned regrowth mask and etch back using self-aligned post-regrowth etch mask metallization; or a BJT having a base contact region formed through selective regrowth using a self-aligned regrowth mask and etch back using self-aligned post-regrowth etch mask metallization.

FIGS. 5A-5I illustrate the manufacture of a SiC vertical trench FET having a p-n junction gate formed through selective epitaxial regrowth using a regrowth masking material and etch back using self-aligned post-epi growth etch mask metallization. In this process, drift 2, channel 3, and source 4 layers are epitaxially grown on a conducting $n^+$ substrate 1 as shown in FIG. 5A.

Figure 5B:
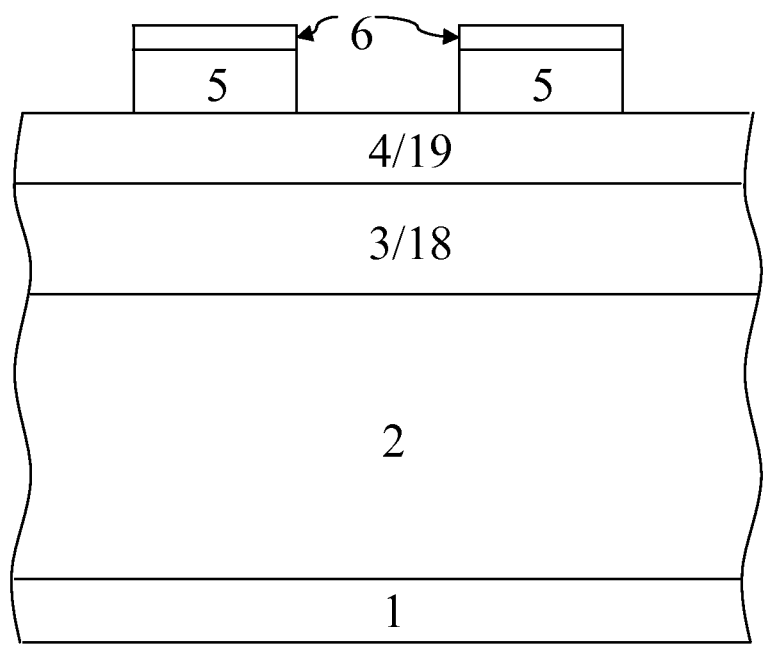
Figure 5C:
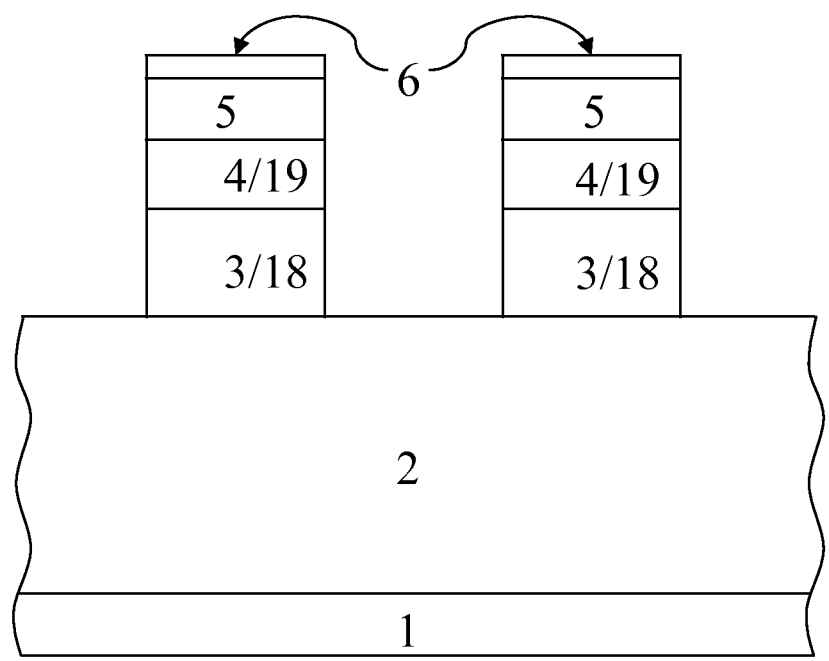

As shown in FIG. 5B, regrowth mask 5 and dry etch mask 6 are patterned on top of source layer 4 and define the source fingers. The dry etch mask 6 can be patterned directly on top of 5 and may be used as a dry etch mask to pattern 5. Next, as shown in FIG. 5C, the SiC regions not covered by layers 5 and 6 are dry etched through the $n^+$ layer 4 and through the channel layer 3. Ideally, the SiC dry etch should completely etch through layer 3 without etching into the drift layer 2. However, not completely etching through 3 or etching into 2 does not change the basic functionality of the device being fabricated and does not impact further processing steps. The dry etch should also be primarily anisotropic so that the sidewalls of the resulting SiC structures are mostly vertical. A small amount of sloping is acceptable.

Figure 5D:
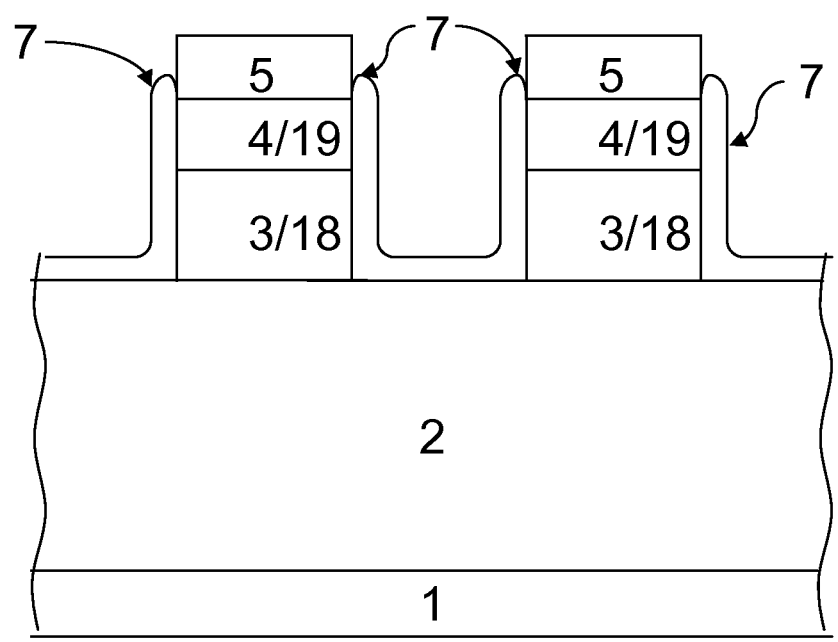

Following the SiC dry etch shown in FIG. 5D, the dry etch mask 6 is removed while the regrowth mask 5 is left on top of the source fingers. After removal of dry etch mask 6, a p-type SiC layer 7 is grown epitaxially over the SiC regions not covered by the regrowth mask material 5. This p-layer 7 forms the p-n junction gate of the transistor.

Figure 5E:
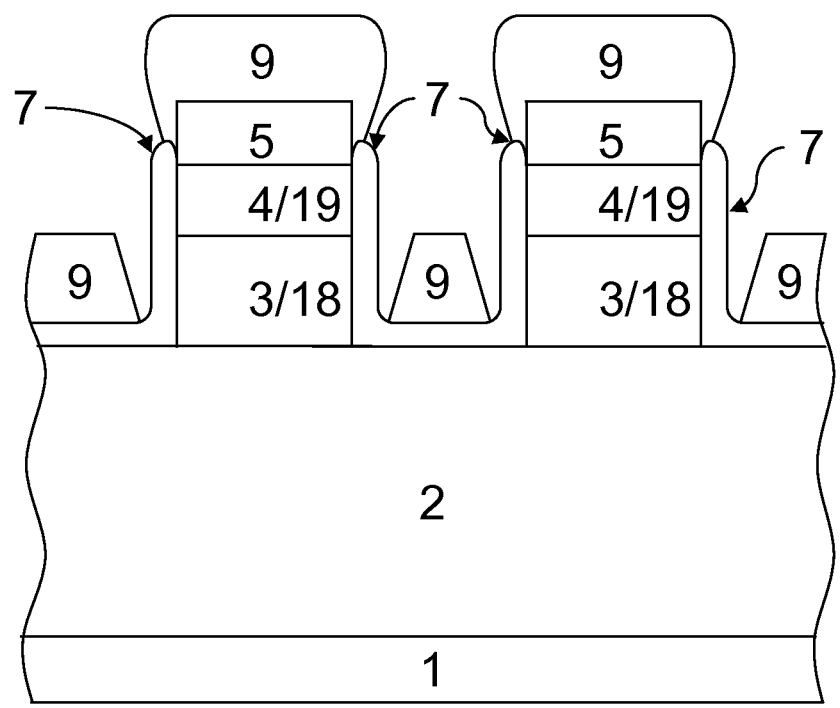
Figure 5F:
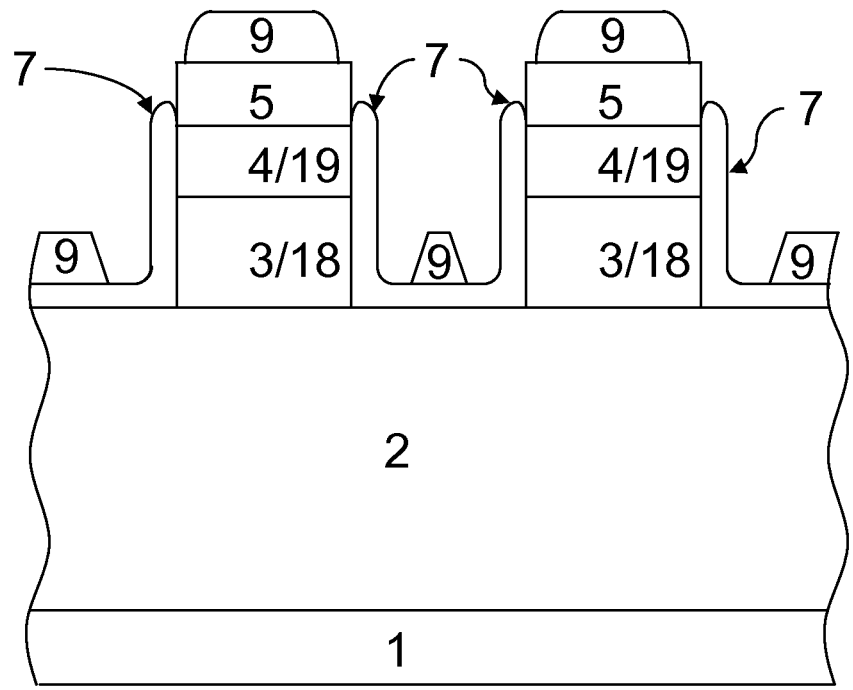
Figure 5G:
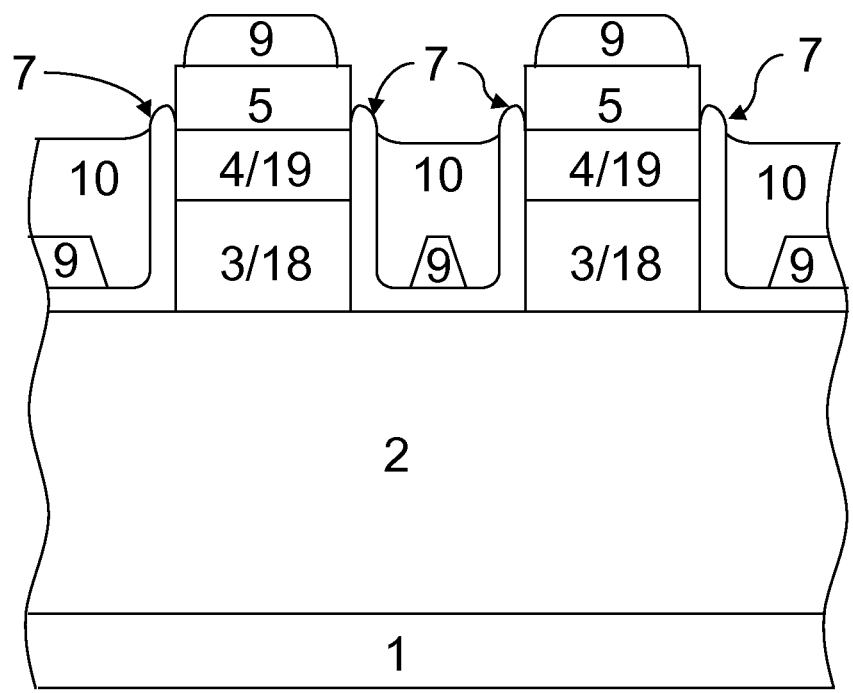

Next, a dry etch mask material 9 is anisotropically deposited such that there is very little of the mask material deposited on the sides of the source fingers as shown in FIG. 5E. Regrowth mask 5 can optionally be removed prior to deposition of dry etch mask material 9 (not shown). However, it may be advantageous to leave regrowth mask 5 in place to provide protection during later etch steps. Mask layer 9 is then isotropically etched by either wet or dry process until the mask material has receded enough to expose the gate layer 7 along the sides of the source fingers as shown in FIG. 5F. The mask layer 9 should be deposited thick enough such that the etch mask material has sufficient vertical thickness to be used as a SiC dry etch mask after the desired amount of horizontal recess has been achieved. A planarizing layer 10 is then deposited and etched back to expose the tops of the source fingers including the top portions of layer 7 on the sides of the source fingers as shown in FIG. 5G. The order of the processes illustrated in FIGS. 5F and 5G can be reversed.

Figure 5H:
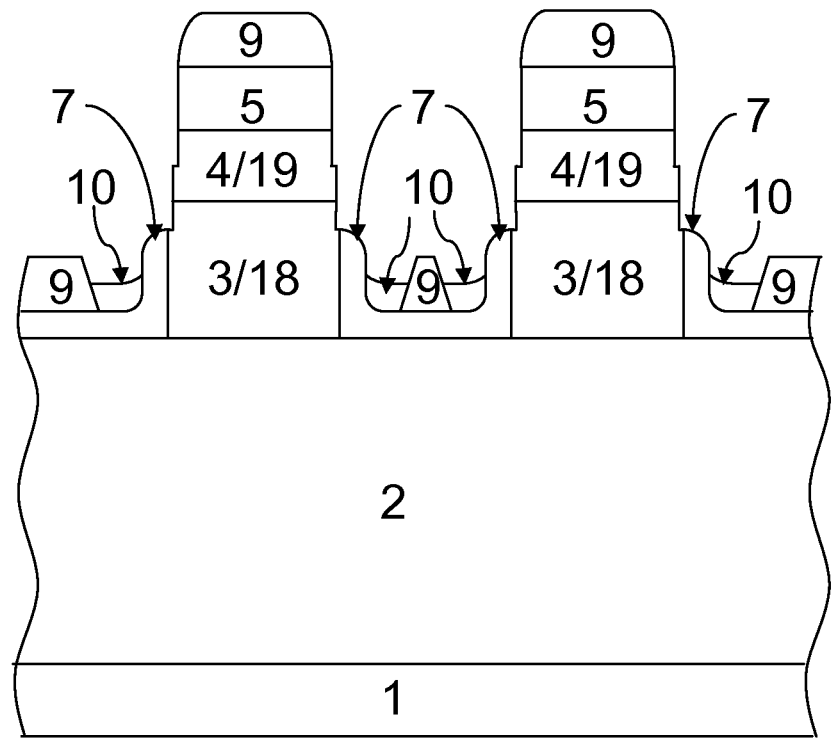

The exposed portion of layer 7 is then dry etched down until none of layer 7 is in contact with the $n^+$ source layer 4 as shown in FIG. 5H. A certain amount of overetch can be used to increase the maximum reverse voltage of the source to gate p-n junction. If ohmic contacts were formed on top of the source fingers prior to the deposition of layers 9 and 10, the exposed ohmic contact metallization must first be etched away before the SiC etch is performed. Layers 9 and 10 should be thick enough to protect the tops of the source fingers and the bottom surfaces of the gate trenches during the SiC etch.

Figure 5I:
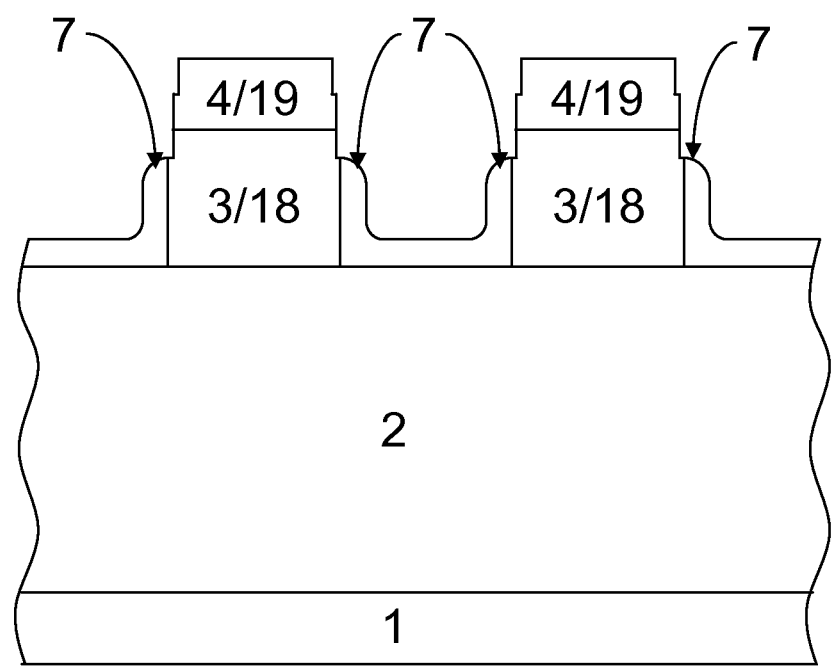

The planarizing layer 10, regrowth mask 5 (if present) and self-aligned etch mask 9 are then stripped as shown in FIG. 5I and the device is ready to receive ohmic contacts and passivation. If ohmic contacts were formed prior to the last SiC etch, the self-aligned etch mask 9 may be left to serve as additional metallization on top of the source and gate ohmic contacts.

FIGS. 5A-5I also illustrate a corresponding method of making a BJT wherein channel layer 3 is substituted with a layer of p-type semiconductor material 18 which forms the base of the device. In this device, n-type layer 19 forms the emitter and p-type regrown layer 7 functions as a base contact.

While the foregoing specification teaches the principles of the present invention, with examples provided for the purpose of illustration, it will be appreciated by one skilled in the art from reading this disclosure that various changes in form and detail can be made without departing from the true scope of the invention.

REFERENCES

[1] C. Li, J. Seiler, I. Bhat, and T. P. Chow, "Selective Growth of 4H—SiC on 4H—SiC Substrates Using a High Temperature Mask," Materials Science Forum Vols. 457-460 (2004) pp. 185-188
[2] J. N. Merrett, J. R. Williams, J. D. Cressler, A. Sutton, L. Cheng, V. Bondarenko, I. Sankin, D. Seale, M. S. Mazzola, B. Krishnan, Y. Koshka, and J. B. Casady, "Gamma and Proton Irradiation Effects on 4H—SiC Depletion-Mode Trench JFETs" presented in 5th European Conference on Silicon Carbide and Related Materials (ECSCRM2004), Aug. 31-Sep. 4, 2004, Bologna, Italy.
[3] L. Cheng, I. Sankin, J. N. Merrett, V. Bondarenko, R. Kelley, S. Purohit, Y. Koshka, J. R. B. Casady, J. B. Casady, and M. S. Mazzola, "Cryogenic and High Temperature Performance of 4H—SiC Vertical Junction Field Effect Transistors (VJFETs) for Space Applications," Proceedings of The 17th International Symposium on Power Semiconductor Devices and ICs (ISPSD '05), May 22-26, 2005, Santa Barbara, Calif.

What is claimed is:

1. A semiconductor device made by a method comprising:
disposing an etch mask on an upper surface of a source/emitter layer of semiconductor material of a first conductivity type, wherein the source/emitter layer is on a channel layer of semiconductor material of the first conductivity type or a base layer of semiconductor material of a second conductivity type different than the first conductivity type, wherein the channel or base layer is on a drift layer of semiconductor material of the first conductivity type and wherein the drift layer is on a semiconductor substrate layer;
selectively etching through the source/emitter layer and into the underlying channel or base layer through openings in the etch mask to form one or more etched features having bottom surfaces and sidewalls;
removing the etch mask to expose the upper surface of the source/emitter layer;
epitaxially growing a gate layer/base contact layer of semiconductor material of the second conductivity type on the upper surface of the source/emitter layer and on the bottom surfaces and sidewalls of the etched features;
subsequently filling the etched features with a first planarizing material;
etching through the gate layer/base contact layer on the upper surface of the source/emitter layer to expose underlying source/emitter layer;
removing first planarizing material remaining after etching through the gate layer/base contact layer;
anisotropically depositing a dry etch mask material on the upper surface of the source/emitter layer and on bottom surfaces of the etched features;
etching the dry etch mask material to expose gate layer/base contact layer on the sidewalls of the etched features adjacent the upper surface of the source/emitter layer;
filling the etched features with a second planarizing material such that the gate layer/base contact layer adjacent the source/emitter layer on the sidewalls of the etched features is exposed;
etching through exposed gate layer/base contact layer on the sidewalls of the etched features adjacent the source/emitter layer to expose underlying source/emitter layer until the gate layer/base contact layer remaining in the etched features no longer contacts the source/emitter layer; and
removing second planarizing material remaining after etching through exposed gate layer/base contact layer on the sidewalls of the etched features.

2. The semiconductor device of claim 1, wherein the device comprises a channel layer of semiconductor material of the first conductivity type.

3. The semiconductor device of claim 1, wherein the device comprises a base layer of semiconductor material of the second conductivity type.

4. The semiconductor device of claim 1, wherein the etched features comprise a plurality of first elongate regions oriented in a first direction and extending from a second elongate region oriented in a second direction.

5. A semiconductor device made by a method comprising:
disposing an etch mask on an upper surface of a channel layer of semiconductor material of a first conductivity type or a base layer of semiconductor material of a aecond conductivity type different than the first conductivity type, wherein the channel or base layer is on a drift layer of semiconductor material of the first conductivity type and wherein the drift layer is on a semiconductor substrate layer;
selectively etching the channel or base layer through openings in the mask to form one or more etched features having bottom surfaces and sidewalls;
removing the etch mask to expose the upper surface of the channel or base layer;
epitaxially growing a gate layer/base contact layer of semiconductor material of the second conductivity type on the upper surface of the channel or base layer and on the bottom surfaces and sidewalls of the etched features;
subsequently filling the etched features with a first planarizing material;
etching through the gate layer/base contact layer on the upper surface of the channel or base layer such that gate layer/base contact layer remains on the bottom surfaces and sidewalls of the etched features;
removing first planarizing material remaining after etching through the gate layer/base contact layer;
depositing a regrowth mask layer on the upper surface of the channel or base layer and on the gate layer/base contact layer on the bottom surfaces and sidewalls of the etched features;
subsequently filling the etched features with a second planarizing material;
etching through the regrowth mask layer on the upper surface of the channel or base layer to expose underlying channel or base layer, wherein regrowth mask layer remains on the gate layer/base contact layer on the bottom surfaces and sidewalls of the etched features;
removing second planarizing material remaining after etching through the regrowth mask layer;
epitaxially growing a first layer of semiconductor material of the first conductivity type on the upper surface of the channel or base layer, wherein the regrowth mask layer remaining on the gate layer/base contact layer on the bottom surfaces and sidewalls of the etched features inhibits growth of the first layer of semiconductor material of the first conductivity type;
epitaxially growing a second layer of semiconductor material of the first conductivity type on the first layer of semiconductor material of the first conductivity type, wherein the regrowth mask layer remaining on the gate layer/base contact layer on the bottom surfaces and sidewalls of the etched features inhibits growth of the second layer of semiconductor material of the first conductivity type; and removing remaining regrowth mask layer.

6. The semiconductor device of claim 5, wherein the device comprises a channel layer of semiconductor material of the first conductivity type.

7. The semiconductor device of claim 5, wherein the device comprises a base layer of semiconductor material of the secondctivity type.

8. The semiconductor device of claim 5, wherein the etched features comprise a plurality of first elongate regions oriented in a first direction and extending from a second elongate region oriented in a second direction.

9. A semiconductor device made by a method comprising:
disposing an etch mask on an upper surface of a source/emitter layer of semiconductor material of a first conductivity type, wherein the source/emitter layer is on a channel layer of semiconductor material of the first conductivity type or a base layer of semiconductor material of a second conductivity type different than the first conductivity type, wherein the channel or base layer is on a drift layer of semiconductor material of the first conductivity type and wherein the drift layer is on a semiconductor substrate layer;
selectively etching through the source/emitter layer and into the underlying channel or base layer through openings in the etch mask to form one or more etched features having bottom surfaces and sidewalls;
removing the etch mask to expose the upper surface of the source/emitter layer;
epitaxially growing a gate layer/base contact layer of semiconductor material of the second conductivity type on the upper surface of the source/emitter layer and on the bottom surfaces and sidewalls of the etched features;
subsequently filling the etched features with a planarizing material;
etching through the gate layer/base contact layer on the upper surface of the source/emitter layer and on the sidewalls of the etched features in contact with the source/emitter layer until the gate layer/base contact layer no longer contacts the source/emitter layer, wherein gate layer/base contact layer remains on the bottom surfaces of the etched features and on the sidewalls of the etched features in contact with the channel or base layer; and
removing planarizing material remaining after etching through the gate layer/base contact layer.

10. The semiconductor device of claim 9, wherein the device comprises a channel layer of semiconductor material of the first conductivity type.

11. The semiconductor device of claim 9, wherein the device comprises a base layer of semiconductor material of the second conductivity type.

12. The semiconductor device of claim 9, wherein the etched features comprise a plurality of first elongate regions oriented in a first direction and extending from a second elongate region oriented in a second direction.

13. A semiconductor device made by a method comprising:
disposing an etch/regrowth mask on an upper surface of a source/emitter layer of semiconductor material of a first conductivity type, wherein the source/emitter layer is on a channel layer of semiconductor material of the first conductivity type or a base layer of semiconductor material of a second conductivity type different than the first conductivity type, wherein the channel or base layer is on a drift layer of semiconductor material of the first conductivity type and wherein the drift layer is on a semiconductor substrate layer;
selectively etching through the source/emitter layer and into the underlying channel or base layer through openings in the mask to form one or more etched features having bottom surfaces and sidewalls;
epitaxially growing semiconductor material of the second conductivity type on the bottom surfaces and sidewalls of the etched features through openings in the mask to form gate regions/base contact regions, wherein the mask inhibits growth on the masked upper surface of the source/emitter layer;
optionally removing the mask to expose the upper surface of the source/emitter layer;
depositing a dry etch mask material on bottom surfaces of the etched features and on either the upper surface of the source/emitter layer or on the mask;
etching the dry etch mask material to expose upper portions of the gate regions/base contact regions on the sidewalls of the etched features;
filling the etched features with a planarizing material such that the upper portions of the gate regions/base contact regions on the sidewalls of the etched features remain exposed;
etching through exposed gate layer/base contact layer on the sidewalls of the etched features adjacent the source/emitter layer to expose underlying source/emitter layer until the gate layer/base contact layer remaining in the etched features no longer contacts the source/emitter layer; and
removing etch/regrowth mask and planarizing material remaining after etching through exposed gate layer/base contact layer on the sidewalls of the etched features.

14. The semiconductor device of claim 13, wherein the device comprises a channel layer of semiconductor material of the first conductivity type.

15. The semiconductor device of claim 13, wherein the device comprises a base layer of semiconductor material of the second conductivity type.

16. The semiconductor device of claim 13, wherein the etched features comprise a plurality of first elongate regions oriented in a first direction and extending from a second elongate region oriented in a second direction.

17. A semiconductor device comprising:
a semiconductor substrate layer;
a drift layer of semiconductor material of the first conductivity type on the semiconductor substrate layer;
one or more raised regions on the drift layer, wherein each of the one or more raised regions comprises a source/emitter layer of semiconductor material of a first conductivity type, wherein the source/emitter layer is on a channel layer of semiconductor material of the first conductivity type or a base layer of semiconductor material of a second conductivity type different than the first conductivity type, wherein the channel or base layer is on the drift layer and wherein the raised regions have lower portions comprising a lower portion of the channel or base layer and an upper portion comprising an upper portion of the channel or base layer and the source/emitter layer; and
one or more epitaxial gate or base contact regions comprising semiconductor material of the second conductivity type on the drift layer adjacent the raised regions and on the lower sidewall portions of the one or more raised regions, wherein the epitaxial gate or base contact regions do not contact the source/emitter layer; and wherein the width of the upper portion of the raised regions is less than the width of the lower portion of the raised region such that a ledge is formed in the channel or base layer adjacent the gate or base contact region on the sidewalls of the raised regions.

18. The semiconductor device of claim 17, wherein the first conductivity type is n-type and wherein the second conductivity type is p-type.

19. The semiconductor device of claim 18, wherein the substrate is an n-type substrate.

20. The semiconductor device of claim 17, wherein the drift layer has a doping concentration of $1 \times 10^{14}$ to $1 \times 10^{17}$ atoms/cm$^3$.

21. The semiconductor device of claim 17, wherein the channel or base layer has a doping concentration of $1 \times 10^{15}$ to $1 \times 10^{18}$ atoms/cm$^3$.

22. The semiconductor device of claim 17, wherein the source/emitter layer has a doping concentration greater than $1 \times 10^{18}$ atoms/cm$^3$.

23. The semiconductor device of claim 17, wherein the epitaxial gate or base contact regions have a doping concentration greater than $1 \times 10^{18}$ atoms/cm$^3$.

24. The semiconductor device of claim 17, wherein the thickness of the epitaxial gate or base contact regions is at least 50 nm.

25. The semiconductor device of claim 17, wherein the substrate is semi-insulating.

26. The semiconductor device of claim 17, wherein the semiconductor substrate layer and the semiconductor material of the source/emitter layer, the channel or base layer, the drift layer, and the epitaxial gate or base contact regions is a SiC semiconductor material.

27. The semiconductor device of claim 17, wherein a buffer layer of semiconductor material of the first conductivity type is between the substrate layer and the drift layer.

28. The semiconductor device of claim 17, further comprising a contact on the source/emitter layer, a contact on the epitaxial gate or base contact regions and a contact on the substrate layer opposite the drift layer.

29. The semiconductor device of claim 17, wherein the one or more raised regions comprise a plurality of first elongate regions oriented in a first direction and extending from a second elongate region oriented in a second direction.

30. The semiconductor device of claim 29, wherein the second direction is approximately perpendicular to the first direction.

31. The semiconductor device of claim 17, wherein the epitaxial gate or base contact regions comprise a first layer of semiconductor material of the second conductivity type on the drift layer adjacent the raised regions and on the lower sidewall portions of the raised regions and a second layer of semiconductor material of the second conductivity type on the first layer, wherein the doping concentration of the first layer is lower than the doping concentration of the second layer.

* * * * *